(12) United States Patent
Cha et al.

(10) Patent No.: US 9,880,335 B2
(45) Date of Patent: Jan. 30, 2018

(54) LIGHT SOURCE UNIT, METHOD OF MANUFACTURING THE SAME, AND BACKLIGHT UNIT HAVING THE SAME

(71) Applicant: SAMSUNG DISPLAY CO., LTD., Yongin, Gyeonggi-Do (KR)

(72) Inventors: HanMoe Cha, Seoul (KR); Seung-Hwa Ha, Osan-si (KR); Donghoon Kim, Suwon-si (KR); Seokhyun Nam, Seoul (KR); Hayoung Lee, Seoul (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 314 days.

(21) Appl. No.: 14/100,586

(22) Filed: Dec. 9, 2013

(65) Prior Publication Data
US 2015/0009453 A1 Jan. 8, 2015

(30) Foreign Application Priority Data
Jul. 2, 2013 (KR) .......................... 10-2013-0077330

(51) Int. Cl.
*G02F 1/1335* (2006.01)
*F21V 8/00* (2006.01)
(Continued)

(52) U.S. Cl.
CPC ..... *G02B 6/0001* (2013.01); *G02F 1/133603* (2013.01); *H01L 33/486* (2013.01);
(Continued)

(58) Field of Classification Search
CPC ........... G02F 1/133615; F21Y 2102/02; G02B 6/0001
See application file for complete search history.

(56) References Cited

U.S. PATENT DOCUMENTS 8,294,168 B2   10/2012  Park et al.
8,740,398 B2 *  6/2014  You ......................... G03B 15/05
                                                    362/16

(Continued)

FOREIGN PATENT DOCUMENTS

JP       2011-029380       2/2011
KR     1020080008765       1/2008
(Continued)

*Primary Examiner* — Dung Nguyen
(74) *Attorney, Agent, or Firm* — F. Chau & Associates, LLC

(57) ABSTRACT

A light source unit includes a light source configured to emit a light, a first case including a first groove configured to receive the light source therein, a first sealing member disposed in the first groove and covering the light source, a second case disposed on the first case and including a first opening portion overlapping with the first groove, and a quantum dot member disposed between the first case and the second case and including a light conversion area configured to convert the light to a white light and a defect area surrounding the light conversion area. The first opening portion is disposed through the second case, a portion of the light conversion area overlaps with the first opening portion and the first groove, and the light source unit is configured such that the white light exits therefrom through the first opening portion.

12 Claims, 23 Drawing Sheets

(51) Int. Cl.
  *H01L 33/48*   (2010.01)
  *H01L 33/60*   (2010.01)
  *H01L 33/50*   (2010.01)

(52) U.S. Cl.
  CPC .......... *H01L 33/507* (2013.01); *G02B 6/0023* (2013.01); *G02F 2001/133614* (2013.01); *G02F 2202/108* (2013.01); *H01L 33/505* (2013.01); *H01L 33/60* (2013.01)

(56) References Cited

U.S. PATENT DOCUMENTS

| | | | |
|---|---|---|---|
| 2008/0111145 A1* | 5/2008 | Lin | 257/98 |
| 2011/0303940 A1 | 12/2011 | Lee et al. | |
| 2013/0334557 A1* | 12/2013 | Uchida et al. | 257/98 |
| 2015/0137163 A1* | 5/2015 | Harris | 257/98 |

FOREIGN PATENT DOCUMENTS

| | | |
|---|---|---|
| KR | 1020110070120 | 6/2011 |
| KR | 1020120009686 | 2/2012 |
| KR | 1020120067541 | 6/2012 |
| KR | 1020120088273 | 8/2012 |

* cited by examiner

LIGHT SOURCE UNIT, METHOD OF MANUFACTURING THE SAME, AND BACKLIGHT UNIT HAVING THE SAME

CROSS-REFERENCE TO RELATED APPLICATION

This patent application claims priority under 35 U.S.C. §119 to Korean Patent Application No. 10-2013-0077330, filed on Jul. 2, 2013, the disclosure of which is hereby incorporated by reference herein in its entirety.

1. TECHNICAL FIELD

The present disclosure relates to a light source unit, a method of manufacturing the light source unit, and a backlight unit having the light source unit.

2. BACKGROUND OF THE RELATED ART

In recent years, various display devices, such as, for example, a liquid crystal display device, an electrowetting display device, an electrophoretic display device, etc., have been developed.

In general, a display device includes a display panel to display an image and a backlight unit to supply light to the display panel. The display panel controls a transmittance of the light provided from the backlight unit to display the image. The light provided to the display panel from the backlight unit is a white light.

The backlight unit is classified into, for example, an edge-illumination type backlight unit disposed at a side portion of the display panel to supply the light to the display panel and a direct-illumination type backlight unit disposed right under the display panel to supply the light to the display panel. The edge-illumination type backlight unit includes, for example, a light source to generate the light and a light guide plate to guide the light. The light guide plate guides the light emitted from the light source to the display panel.

SUMMARY

Exemplary embodiments of the present invention provide a light source unit capable of increasing the light conversion efficiency.

Exemplary embodiments of the present invention provide a method of manufacturing the light source unit.

Exemplary embodiments of the present invention provide a backlight unit having the light source unit.

Exemplary embodiments of the present invention provide a light source unit including a light source configured to emit a light, a first case that includes a first groove configured to receive a light source therein, a first sealing member disposed in the first groove and covering the light source, a second case disposed on the first case and including a first opening portion overlapping with the first groove, and a quantum dot member disposed between the first case and the second case and including a light conversion area configured to convert the light to a white light and a defect area surrounding the light conversion area. The first opening portion is disposed through the second case, a portion of the light conversion area overlaps with the first opening portion and the first groove, and the light source unit is configured such that the white light exits therefrom through the first opening portion.

The second case further includes a second opening portion disposed at a front surface of the second case, upwardly recessing from a lower surface of the second case, and extending in a first direction substantially parallel to the front surface of the second case, a second groove upwardly recessing from the lower surface of the second case and inwardly spaced apart from the front surface, a rear surface, a left surface, and a right surface of the second case, and a first hole disposed through the second case and disposed adjacent to the rear surface of the second case. The second opening portion and the quantum dot member have a first length in the first direction, the second groove has a second length longer than the first length, and the second opening portion overlaps with the second groove in a second direction vertically crossing the first direction.

A portion of a center of the second groove is connected to the first opening portion, the second groove is connected to the second opening portion in a front surface direction of the second case, the first hole is overlapped with the second groove and not overlapped with the quantum dot member, and each of the quantum dot member, the second opening portion, and the second groove has a first height in an upper direction.

The quantum dot member is inserted into the second opening portion and the second groove, the defect area partially overlaps with the second opening portion and the second groove, and a rear surface of the quantum dot member, a left surface of the quantum dot member, and a right surface of the quantum dot member are spaced apart from an inner surface of the second groove.

The light source further includes a second sealing member disposed between the inner surface of the second groove and the rear surface of the quantum dot member, the left surface of the quantum dot member, and the right surface of the quantum dot member.

The second case further includes a plurality of second opening portions respectively disposed at a front surface of the second case, a rear surface of the second case, a left surface of the second case, and a right surface of the second case and which upwardly recess from a lower surface of the second case, a second groove upwardly recessing from the lower surface of the second case and inwardly spaced apart from the front surface of the second case, the rear surface of the second case, the left surface of the second case, and the right surface of the second case by, and a first hole disposed through the second case and disposed adjacent to the rear surface of the second case. The second opening portions and the quantum dot member have a first length in a first direction substantially parallel to the front surface of the second case and a second direction vertically crossing the first direction in a plan view, the second groove has a second length longer than the first length in the first and second directions, and the second opening portions overlap with the second groove in the first and second directions.

A portion of a center of the second groove is connected to the first opening portion, the second groove is connected to the second opening portions in a front surface direction of the second case, a rear surface direction of the second case, a left surface direction of the second case, and a right surface direction of the second case, the first hole is disposed at a boundary between the second groove and the second opening portion disposed at the rear surface of the second case, and each of the quantum dot member, the second opening portions, and the second groove has a first height in an upper direction.

The quantum dot member is disposed in the second groove and inwardly spaced apart from an outer boundary of the second groove, and the defect area is inwardly spaced apart from the outer boundary of the second groove and partially overlaps with the second groove.

The light source further includes a second sealing member disposed in an area of the second groove, in which the quantum dot member is not disposed, and the second opening portions are disposed.

Exemplary embodiments of the present invention provide a method of manufacturing a light source unit including preparing a first case including a first groove in which a light source is disposed and a first sealing member disposed in the first groove and covering the light source, disposing a second case including a first opening portion on the first case and in which the first opening portion overlaps with the first groove, and disposing a quantum dot member between the first case and the second case. The quantum dot member includes a light conversion area configured to convert a light emitted from the light source to a white light and a defect area surrounding the light conversion area. A portion of the light conversion area overlaps with the first opening portion and the first groove, and the light source unit is configured such that the white light exits therefrom through the first opening portion.

Exemplary embodiments of the present invention provide a backlight unit including a light source unit configured to emit a white light and an optical sheet configured to diffuse the white light and condense the white light upwards. The light source unit includes a light source configured to emit a light, a first case that includes a first groove configured to receive the light source therein, a first sealing member disposed in the first groove and covering the light source, a second case disposed on the first case and including a first opening portion overlapping with the first groove, and a quantum dot member disposed between the first case and the second case and including a light conversion area configured to convert the light to the white light and a defect area surrounding the light conversion area. The first opening portion is disposed through the second case, a portion of the light conversion area overlaps with the first opening portion and the first groove, and the light source unit is configured such that the white light exits therefrom through the first opening portion.

Exemplary embodiments of the present invention provide a backlight unit including a light source unit configured to emit a light, a quantum dot member that includes a light conversion area configured to convert the light to a white light and a defect area surrounding the light conversion area, a frame member configured to hold the quantum dot member, accommodate the defect area, and expose a portion of the light conversion area, and an optical sheet configured to diffuse the white light provided from the quantum dot member and condense the white light upwards.

According to exemplary embodiments, a display device is provided. The display device includes a display panel including a thin film transistor substrate on which a plurality of pixels are disposed, a color filter substrate facing the thin film transistor substrate and a liquid crystal layer disposed between the thin film transistor substrate and the color filter substrate. The pixels include a pixel electrode and a thin film transistor connected to the pixel electrode. The display panel further includes a gate driver configured to generate and apply gate signals to the pixels, a driving circuit board, a data driver including a plurality of source driving chips connected to the driving circuit board and the thin film transistor substrate, in which the data driver is configured to generate and apply data voltages to the pixels, and a backlight unit.

The backlight unit of the display device includes a substrate, a light source unit disposed on the substrate and includes a first case including a first groove having a sidewall which is inclined with respect to a bottom surface of the first groove, a light source configured to emit blue light and disposed in the first groove, in which an upper surface of the first case is higher than an upper surface of the light source disposed in the groove, a first sealing member disposed in the first groove and covering the light source, in which the first sealing member includes a transparent organic material, a second case coupled to the first case and including a first opening portion overlapping with the first groove, a second groove upwardly recessing from a lower surface of the second case, a second opening portion disposed at a front side of the second case and upwardly recessing from a lower portion of the second case and overlapping with the second groove, and a first hole disposed in the second case and overlapping with the second groove, and a quantum dot member disposed in the second opening portion and the second groove of the second case and which does not overlap with the first hole. The quantum dot member includes a light conversion area configured to convert the blue light emitted from the light source to a white light and a defect area surrounding the light conversion area. An area in which the first groove of the first case is overlapped with the first opening portion of the second case is configured to transmit the white light and an area of the first case except for the first groove and an area of the second case except for the first opening portion are configured to block the blue light from reaching the defect area. The light source unit is configured such that the white light exits therefrom through the first opening portion.

The backlight unit of the display device further includes a light guide plate, a reflection plate disposed under the light guide plate, and an optical sheet disposed above the light guide plate. The light source unit is disposed adjacent to a side surface of the light guide plate and is configured to emit the white light to the light guide plate. The reflection plate is configured to reflect the white light exiting from a lower surface of the light guide plate such that the reflected white light travels back to the light guide plate, and the optical sheet is configured to diffuse the white light and condense the white light upwards.

According to exemplary embodiments of the present invention, the light source unit and the backlight unit having the light source unit may have increased light conversion characteristics.

BRIEF DESCRIPTION OF THE DRAWINGS

Exemplary embodiments of the present invention can be understood in more detail from the following detailed description when considered in conjunction with the accompanying drawings in which.

DETAILED DESCRIPTION OF EXEMPLARY EMBODIMENTS

It will be understood that when an element or layer is referred to as being "on", "connected to" or "coupled to" another element or layer, it can be directly on, connected or coupled to the other element or layer or intervening elements or layers may be present. Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, exemplary embodiments of the present invention will be explained in detail with reference to the accompanying drawings.

Figure 1:
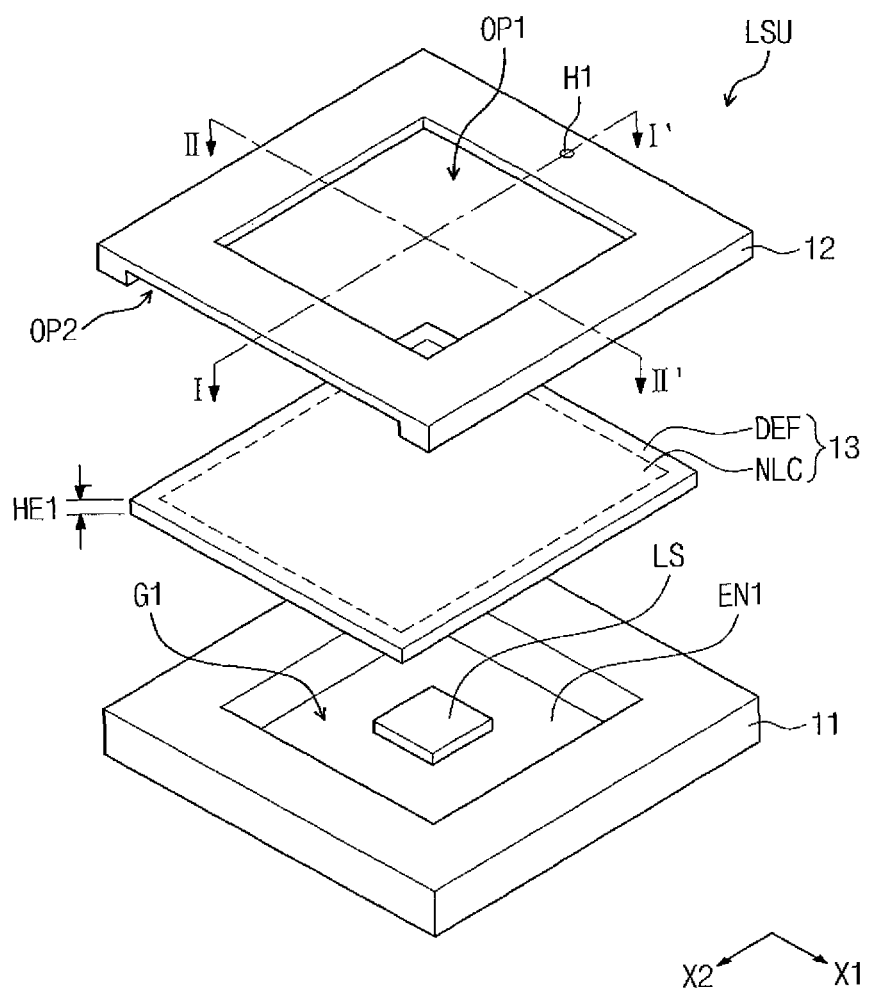
FIG. 1 is an exploded perspective view showing a light source unit according to an exemplary embodiment of the present invention.
Figure 2:
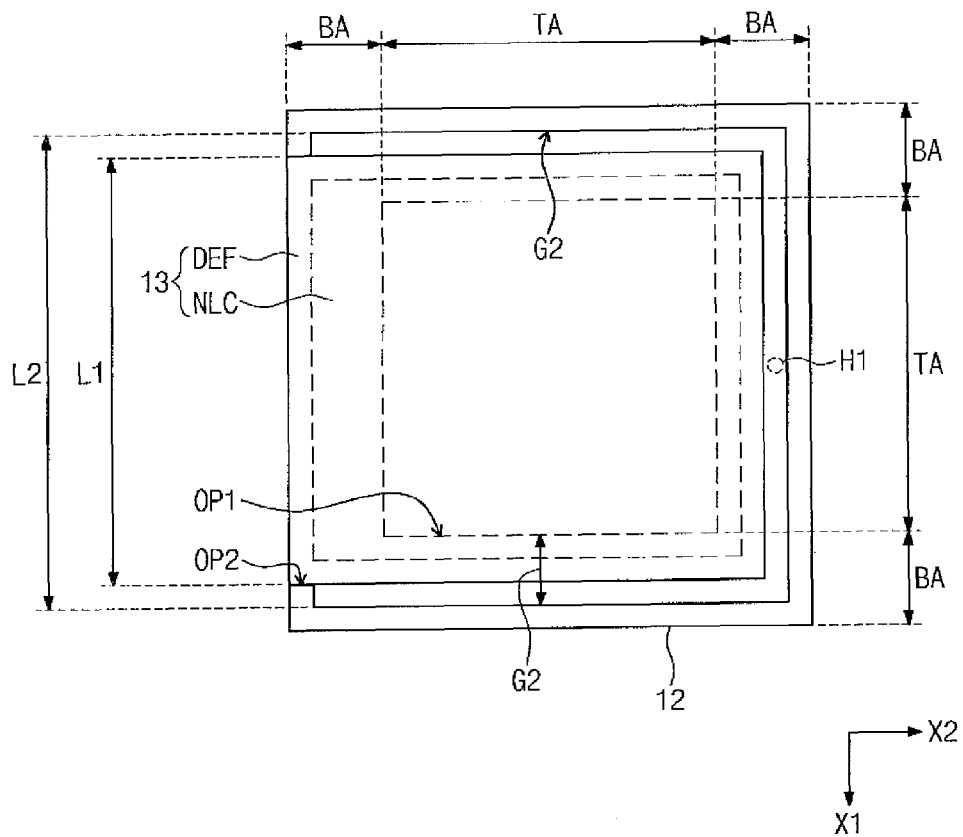
FIG. 2 is a bottom view showing the second case and the quantum dot member shown in FIG. 1.
Figure 3:
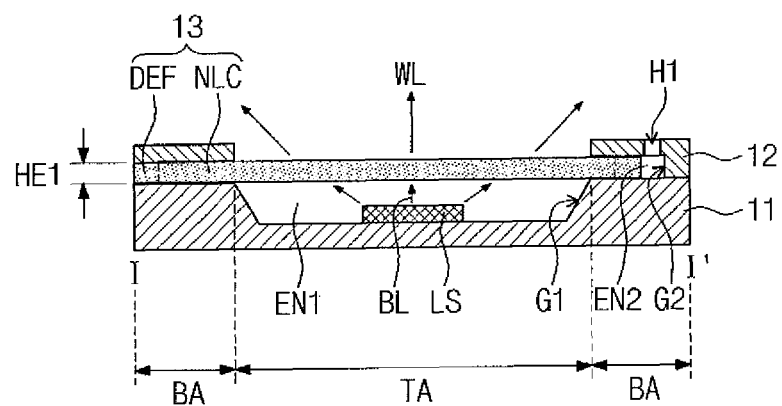
FIG. 3 is a cross-sectional view take along a line I-I' shown in FIG. 1.
Figure 4:
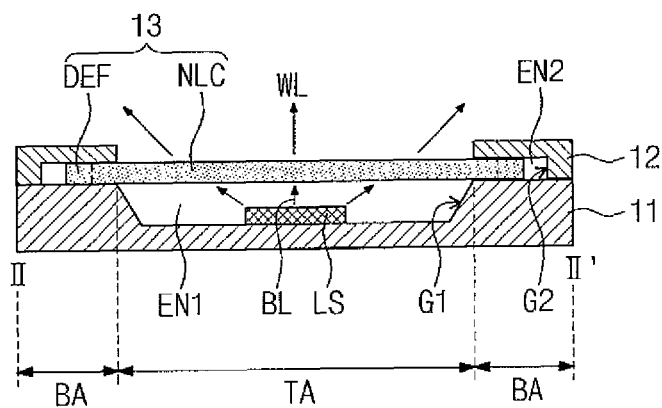
FIG. 4 is a cross-sectional view taken along a line II-II' shown in FIG. 1.

FIG. 1 is an exploded perspective view showing a light source unit according to an exemplary embodiment of the present invention, FIG. 2 is a bottom view showing the second case and the quantum dot member shown in FIG. 1, FIG. 3 is a cross-sectional view take along a line I-I' shown in FIG. 1, and FIG. 4 is a cross-sectional view taken along a line II-II' shown in FIG. 1.

Referring to FIGS. 1 to 4, a light source unit LSU includes, for example, a first case 11, a light source LS, a second case 12, and a quantum dot member 13. The light source LS is disposed in the first case 11 and the quantum dot member 13 is disposed between the first case 11 and the second case 12. The first case 11 and the second case 12 are connected to each other and overlapped with each other to hold the quantum dot member 13.

The first case 11 includes, for example, a first groove G1 formed by, for example, downwardly recessing an upper portion thereof. The light source LS is disposed in the first groove G1. The first groove G1 has, for example, a depth greater than a height of the light source LS. Accordingly, an upper surface of the first case 11 is positioned at a position higher than an upper surface of the light source LS disposed on a bottom surface of the first groove G1. A side surface of the first groove G1 is, for example, inclined with respect to the bottom surface of the first groove G1 as shown in FIGS. 3 and 4.

The light source LS may be, but is not limited to, a blue light emitting diode that emits a blue light. For example, alternatively, in an embodiment, the light source LS may be an elongated cold cathode fluorescent lamp (CCFL) which emits a blue light, or a flat fluorescent lamp (FFL) which emits a blue light. As shown in FIGS. 1, 3, and 4, a first sealing member EN1 is disposed in the first groove G1 to cover the light source LS. The first sealing member EN1 holds the light source LS and protects the light source LS from external humidity and contaminants. The first sealing member EN1 is formed of, for example, a transparent organic material. Thus, the light emitted from the light source LS transmits through the first sealing member EN1.

The second case 12 includes, for example, a first opening portion OP1, a second opening portion OP2, a second groove G2, and a first hole H1. The first opening portion OP1 is formed through the second case 12.

The first opening portion OP1 is disposed to be, for example, overlapped with the first groove G1 as shown in FIGS. 3 and 4. The first opening portion OP1 has, for example, the same shape and size as those of the first groove G1 when viewed in a top view of the first case 11. For instance, the first opening portion OP1 and the first groove G1 have the same shape and size and are overlapped with each other when viewed in the top view of the first case 11, but exemplary embodiments of the present invention are not be limited thereto or thereby. That is, the first opening portion OP1 and the first groove G1 may have, for example, a circular shape.

The second opening portion OP2 is disposed at a front side of the second case 12. The second opening portion OP2 is formed by, for example, upwardly recessing a lower portion of the second case 12. The second opening portion OP2 is, for example, extended in a first direction X1 substantially parallel to the front surface of the second case 12. The second opening portion OP2 has, for example, the same length as that of the quantum dot member 13 in the first direction X1. The second opening portion OP2 and the quantum dot member 13 have, for example, a first length L1 in the first direction X1.

Hereinafter, a direction substantially perpendicular to the first direction X1 is referred to as a second direction X2 when viewed in a plan view. A surface of the second case 12, which faces the front surface of the second case 12, is referred to as a rear surface. Side surfaces facing each other in the first direction X1 and being disposed between the front surface and the rear surface are respectively referred to as a left surface and a right surface of the second case 12.

The second groove G2 is formed by, for example, upwardly recessing the lower surface of the second case 12. The second groove G2 has, for example, a second length L2 in the first direction X1. The second length L2 of the second groove G2 is, for example, longer than the first length L1 of the second opening portion OP2. The second opening portion OP2 is disposed, for example, to be overlapped with the second groove G2 in the second direction X2. The second groove G2 is inwardly spaced apart from the front, rear, left, and right surfaces of the second case 12 by a predetermined distance.

A predetermined area of a center portion of the second groove G2 is connected with the first opening portion OP1, and thus the predetermined area of the center portion of the second groove G2 is exposed to the upper direction. The second groove G2 is connected with the second opening portion OP2 in the front surface direction of the second case 12, and thus the second groove G2 is exposed to the front surface direction.

The first hole H1 is formed through the second case 12. The first hole H1 is disposed to be, for example, overlapped with the second groove G2 and not to be overlapped with the quantum dot member 13.

Hereinafter, surfaces of the quantum dot member 13, which face each other in the second direction X1, are referred to as front and rear surfaces, respectively, and surfaces of the quantum dot member 13, which face each other in the first direction X1, are referred to as left and right surfaces, respectively.

The quantum dot member 13 includes, for example, a light conversion area NLC and a defect area DEF surrounding the light conversion area NLC. A predetermined area of the quantum dot member 13, e.g., an edge area adjacent to the front, rear, left, and right surfaces of the quantum dot member 13, is referred to as the defect area DEF.

The quantum dot member 13 is inserted into the second opening portion OP2 and the second groove G2 and disposed to allow the front surface thereof to match the front surface of the second case 12. The rear surface, the left surface, and the right surface of the quantum dot member 13 are disposed to be, for example, spaced apart from an inner side surface of the second groove G2. In addition, the quantum dot member 13 is disposed, for example, not to be overlapped with the first hole H1.

As shown in FIGS. 2 to 4, a predetermined area of the light conversion area NLC of the quantum dot member 13 is disposed to, for example, overlap with the first opening portion OP1 and is exposed through the first opening portion OP1. In addition, as shown in FIGS. 3 and 4, a predetermined area of the light conversion area NLC of the quantum dot member 13 is disposed to, for example, overlap with the first groove G1. The defect area DEF of the quantum dot member 13 is disposed to, for example, partially overlap with the second opening portion OP2 and the second groove G2.

A second sealing member EN2 is disposed between the inner side surface of the second groove G2 and the rear, left, and right surfaces of the quantum dot member 13. The second sealing member EN2 holds the quantum dot member 13 and protects the quantum dot member 13 from external air and humidity. The second sealing member EN2 may be formed of, for example, an organic material.

Each of the quantum dot member 13, the second opening portion OP2, and the second groove G2 has, for example, a first height HE1 in the upper direction. That is, the height of the quantum dot member 13, the height of the second opening portion OP2, and the height of the second groove G2 are, for example, the same as each other.

As shown in FIGS. 2 to 4, when viewed in a top view, an area in which the first groove G1 of the first case 11 is overlapped with the first opening portion OP1 of the second case 12 is defined as a transmission area TA. An area of the first case 11 except for the first groove G1 and an area of the second case 12 except for the first opening portion OP are defined as a blocking area BA. Therefore, the blocking area BA is disposed to surround the transmission area TA.

The first case 11 and the second case 12 are formed of a material, e.g., a resin mold product, to block the light. Accordingly, the transmission area TA transmits the light and the blocking area BA blocks the light.

According to the configurations of the first and second cases 11 and 12, a predetermined area of the light conversion area NLC of the quantum dot member 13 is disposed to correspond to the transmission area TA as shown in FIGS. 3 and 4. The defect area DEF of the quantum dot member 13 is disposed to correspond to the blocking area BA.

The light emitted from the light source LS transmits through the light conversion area NLC of the quantum dot member 13 overlapped with the first groove G1. The light conversion area NLC of the quantum dot member 13 converts the light provided from the light source LS to a white light WL. The white light WL converted by the light conversion area NLC overlapped with the first groove G1 travels to the outside of the light source unit LSU after passing through the first opening portion OP1 of the second case 12.

The defect area DEF of the quantum dot member 13 is disposed to correspond to the blocking area BA of the first and second cases 11 and 12. The light emitted from the light source LS does not travel to the blocking area BA. Thus, the light emitted from the light source LS is not provided to the defect area DEF.

The quantum dot member 13 includes quantum dots. The quantum dots randomly convert a wavelength band of the light and mix lights having different wavelength bands.

The quantum dot may be particles each having, for example, a size that causes a quantum confinement effect. Each quantum dot has a size of, for example, from about 2 nm to about 15 nm and includes a central body and a shell surrounding the central body. For example, the central body of the quantum dot includes cadmium selenide (CdSe), cadmium telluride (CdTe), cadmium sulfide (CdS), indium gallium phosphide (InGaP), zinc selenide (ZnSe), zinc telluride (ZnTe), zinc sulfide (ZnS), mercury telluride (HgTe), or mercury sulfide (HgS) and the shell of the quantum dot includes zinc sulfide (ZnS), copper zinc sulfide (CuZnS), cadmium selenide (CdSe), cadmium telluride (CdTe), cadmium sulfide (CdS), zinc selenide (ZnSe), zinc telluride (ZnTe), mercury telluride (HgTe), or mercury sulfide (HgS).

The quantum dot is synthesized by, for example, a chemical wet method in which a particle grows by putting a precursor material into an organic solvent. The synthetic method of the quantum dot using the chemical wet method may be performed by well-known conventional methods.

The quantum dot has a strong fluorescence in a narrow wavelength band. The light emitted from the quantum dot is generated while excited electrons drop down to a valence band from a conduction band.

The light emitted from the quantum dot has a short wavelength as the size of the quantum dot decreases and has a long wavelength as the size of the quantum dot increases. Thus, the lights having various wavelengths may be generated according to a quantum size effect.

According to the size of the quantum dot, rainbow-colored lights including, for example, red, green, and blue colors are easily generated. In addition, light emitting diodes each emitting a light in accordance with a size thereof may be manufactured by the size of the quantum dot, and a white color and various colors may be realized by mixing the quantum dots having various sizes.

For example, the quantum dot has a high light emitting efficiency. Therefore, when the white color WL is realized by using the quantum dots, a color reproducibility of the red and green colors becomes higher than that of a conventional light emitting diode.

The quantum dot member 13 includes quantum dots having, for example, different sizes according to a kind of the light source to emit the white light. For instance, the light source LS may be the blue light emitting diode that emits the blue light. In this case, the quantum dot member 13 includes quantum dots having the size to absorb the light having the blue wavelength and quantum dots having the size to emit the light having the red wavelength. Hereinafter, the light emitted from the light source LS is referred to as the blue light BL.

The blue light BL emitted from the light source LS is provided to the light conversion area NLC of the quantum dot member 13 overlapped with the first groove G1. The quantum dots of the quantum dot member 13 absorb the blue light BL to covert the blue light BL to the light having the green or red wavelength. As a result, the lights having the blue, green, and red wavelengths are mixed with each other to emit the white light. That is, the blue light BL emitted from the light source LS is converted to the white light WL while passing through the light conversion area NLC of the quantum dot member 13 overlapped with the first groove G1.

The quantum dot member 13 is, for example, manufactured in the roll shape and used after being cut. A boundary interface of the quantum dot member 13 may be referred to as front, rear, left, and right surfaces of the quantum dot member 13. When the boundary interface of the quantum dot member 13 is exposed to the external air and humidity, a chemical reaction occurs at the boundary interface. Due to the chemical reaction, the light conversion characteristics of the quantum dots are deteriorated. The predetermined area of the quantum dot member 13, which is adjacent to the boundary surface of the quantum dot member 13, corresponds to the defect area DEF in which the light conversion characteristics of the quantum dots are deteriorated.

The quantum dot member 13 converts the blue light BL provided from the light source LS to the white light WL. The light conversion is not performed in the defect area DEF of the quantum dot member 13, in which the quantum dots having the deteriorated light conversion characteristics are disposed. When the blue light BL emitted from the light source LS is provided to the defect area DEF of the quantum dot member 13, the blue light BL from the light source LS is not converted to the white light WL in the defect area DEF of the quantum dot member 13. The blue light BL provided to the defect area DEF of the quantum dot member 13 may exit through the defect area DEF without being converted to the white light WL. Therefore, the light conversion characteristics of the light source unit may be deteriorated.

However, in the present embodiment, the defect area DEF of the quantum dot member 13 is disposed in the blocking area BA of the first and second cases 11 and 12. The blue light BL emitted from the light source LS is not provided to the blocking area BA of the quantum dot member 13. Accordingly, the blue light BL emitted from the light source LS is not provided to the defect area DEF of the quantum dot member 13. As a result, the defect area DEF of the quantum dot member 13 does not perform the light conversion, and thus the blue light BL does not exit from the defect area DEF of the quantum dot member 13.

The blue light BL emitted from the light source LS is provided to the light conversion area NLC of the quantum dot member 13 overlapped with the first groove G1 but not to the defect area DEF of the quantum dot member 13. The light conversion area NLC of the quantum dot member 13 performs the light conversion normally to convert the blue light BL to the white light WL.

As described above, as the blue light BL emitted from the light source LS is provided to the light conversion area NLC of the quantum dot member 13 but not to the defect area DEF, the light conversion is performed normally. Thus, the light conversion characteristics of the light source unit LSU are increased.

Consequently, the light source unit LSU may have increased light conversion characteristics.

Figure 5:
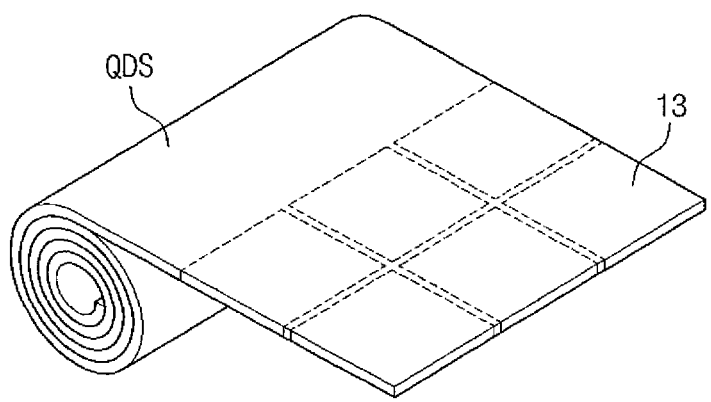
FIG. 5 is a view showing a quantum dot sheet manufactured in a roll shape.

FIG. 5 is a view showing a quantum dot sheet manufactured in a roll shape.

Referring to FIG. 5, the quantum dot sheet QDS may be manufactured, for example, in the roll shape. The quantum dot sheet QDS having the roll shape is cut to form the quantum dot member 13 used for the light source unit LSU.

Figure 6:
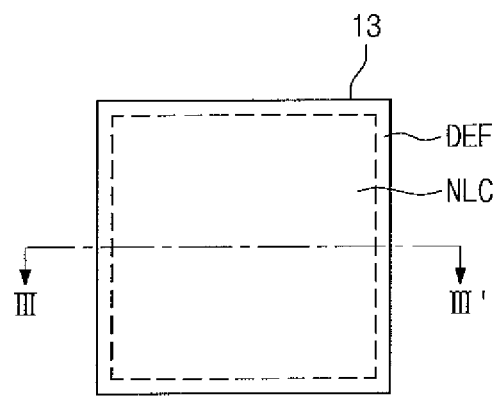
FIG. 6 is a view showing a quantum dot member obtained by cutting the quantum dot sheet shown in FIG. 5.
Figure 7:
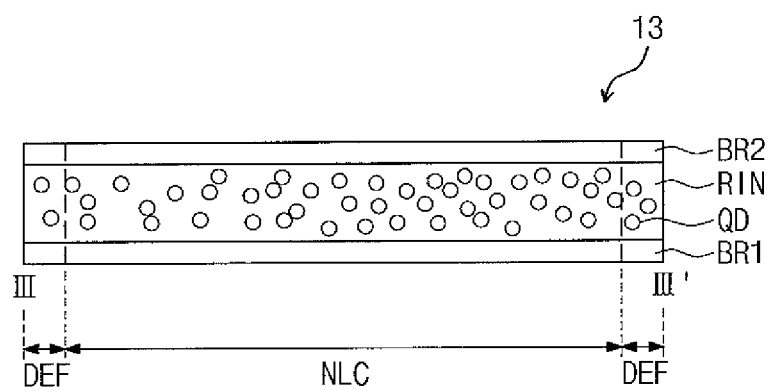
FIG. 7 is a cross-sectional view taken along a line shown in FIG. 6.

FIG. 6 is a view showing the quantum dot member obtained by cutting the quantum dot sheet shown in FIG. 5 and FIG. 7 is a cross-sectional view taken along a line III-III' shown in FIG. 6.

Referring to FIGS. 6 and 7, the quantum dot member 13 includes, for example, a first barrier layer BR1, a second barrier layer BR2, and the quantum dots QD disposed between the first barrier layer BR1 and the second barrier BR2. The quantum dots QD are distributed in, for example, a resin RIN to be disposed between the first barrier layer BR1 and the second barrier layer BR2. For example, in an exemplary embodiment, the resin RIN may be, an insulating polymer resin, such as, a silicon resin, an epoxy resin, or an acrylic resin, etc.

As described above, when the quantum dot member 13 converts the blue light to the white light, the quantum dots QD includes the quantum dots QD having the size to absorb the light having the blue wavelength and the quantum dots QD having the size to emit the light having the red wavelength.

The boundary interface of the quantum dot member 13 is exposed to the external air and humidity, and thus the chemical reaction occurs at the quantum dots QD disposed in the predetermined area DEF of the quantum dot member 13 due to the external air and humidity. Due to the chemical reaction, the light conversion characteristics of the quantum dots QD are deteriorated.

As described above, the predetermined area DEF of the quantum dot member 13 corresponds to the defect area DEF. In addition, the area of the quantum dot member 13 except for the defect area DEF corresponds to the light conversion area NLC.

The quantum dots QD disposed in the defect area DEF do not perform the light conversion normally, so that the light provided to the defect area DEF is not converted to the white light.

The quantum dots QD disposed in the light conversion area NLC performs the light conversion normally as the light conversion characteristics are not deteriorated. That is, the light provided to the light conversion area NLC is converted to the white light.

FIGS. 8A to 8F are views showing a method of manufacturing the light source unit shown in FIG. 1.

Figure 8A:
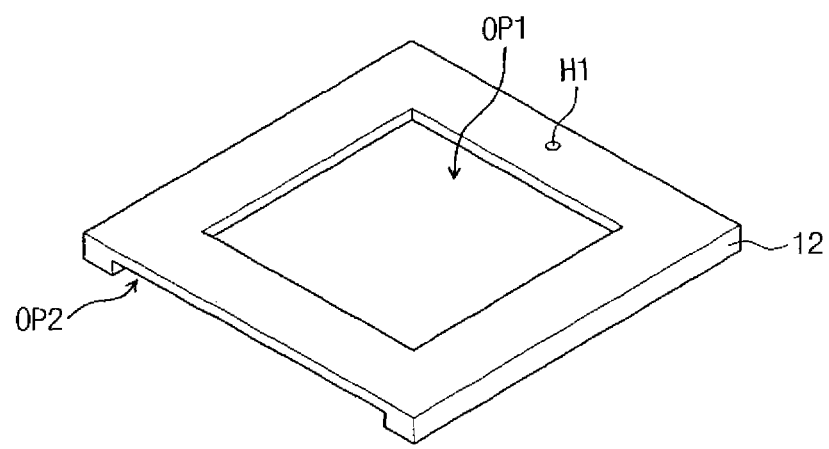
FIGS. 8A to 8F are views showing a method of manufacturing the light source unit shown in FIG. 1.
Figure 8A:
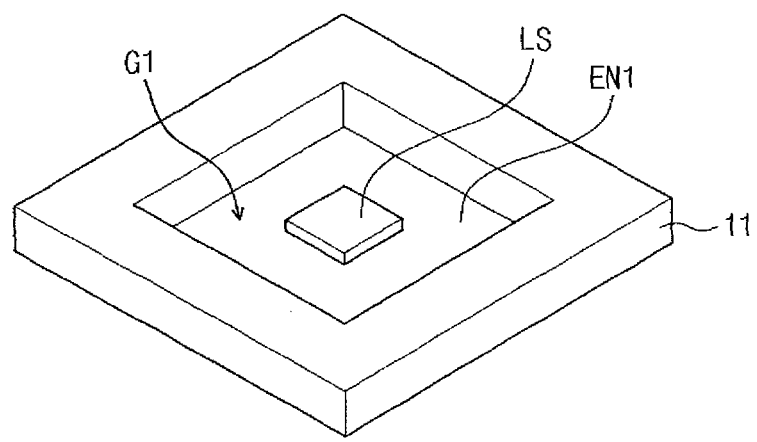

Referring to FIG. 8A, the light source LS is accommodated in the first groove G1 and the first sealing member EN1 is disposed in the first groove G1 to cover the light source LS, thereby preparing the first case 11. The second case 12 is disposed on the first case 11 to overlap with the first case 11.

As described above, the first groove G1 of the first case 11 is overlapped with the first opening portion OP1 of the second case 12. The first case 11 is coupled to the second case 12 while being overlapped with each other.

Figure 8B:
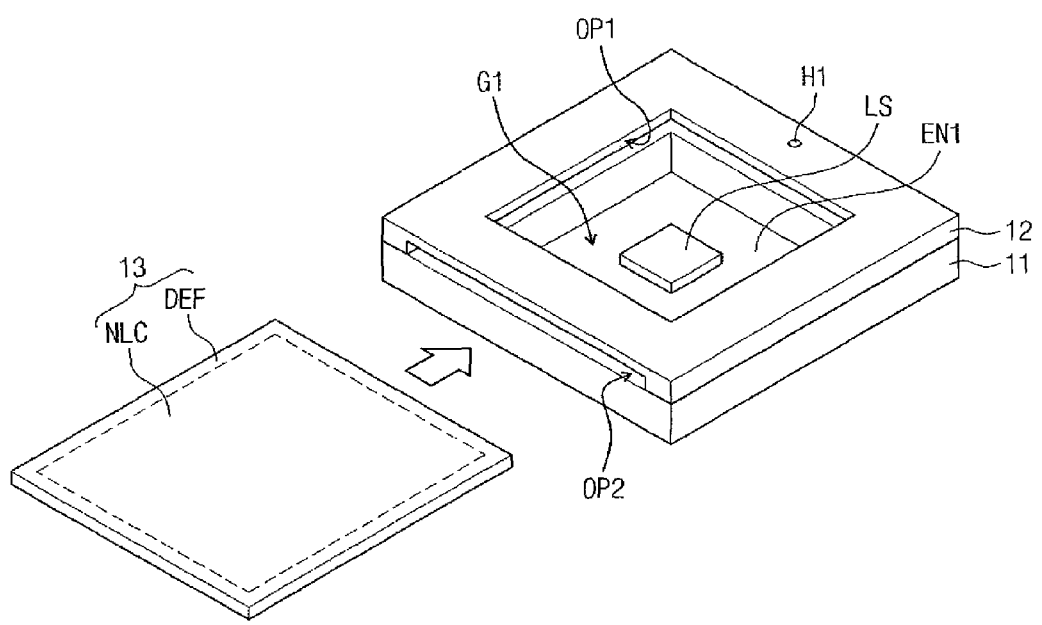

Referring to FIG. 8B, the quantum dot member 13 is disposed between the first case 11 and the second case 12. For example, after the first case 11 is coupled to the second case 12, the quantum dot member 13 is inserted into the second opening portion OP2 and the second groove G2, which are disposed between the first case 11 and the second case 12.

Figure 8C:
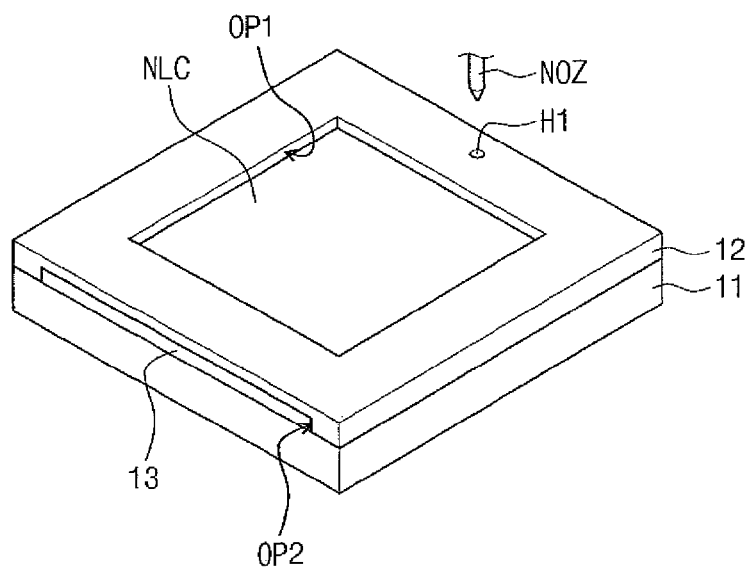

Referring to FIG. 8C, the front surface of the quantum dot member 13 is disposed to match the front surface of second case 12. The predetermined area of the light conversion area NLC of the quantum dot member 13 is disposed to overlap with the first opening portion OP1 and exposed through the first opening portion OP1. A nozzle NOZ is disposed to correspond to the first hole H1. The second sealing member EN2 is injected into the first hole H1 by the nozzle NOZ.

Figure 8D:
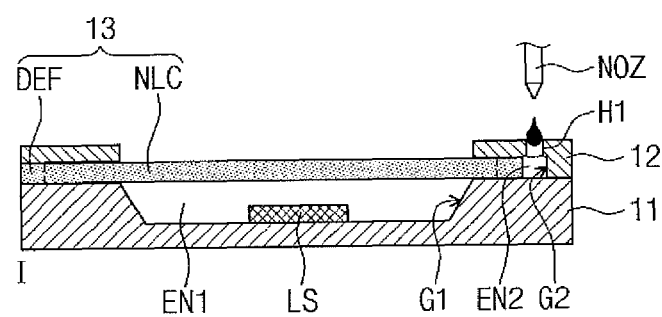
Figure 8E:
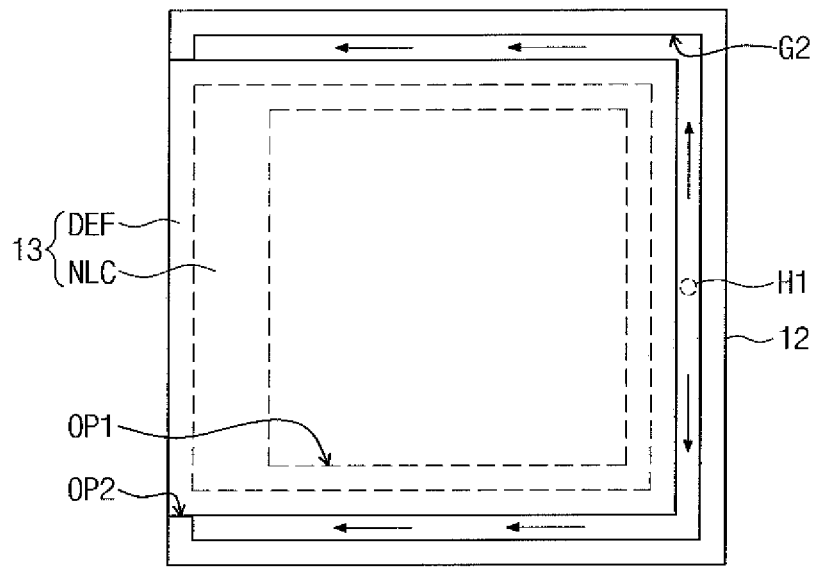

Referring to FIGS. 8D and 8E, the quantum dot member 13 is disposed to be spaced apart from the inner side surface of the second groove G2. The quantum dot member 13 is disposed not to be overlapped with the first hole H1. The first hole H1 is overlapped with the second groove G2 and not overlapped with the quantum dot member 13. Accordingly, the second sealing member EN2 injected into the first hole H1 through the nozzle NOZ is provided to between the inner side surface of the second groove G2 of the rear, left, and right surfaces of the quantum dot member 13.

Figure 8F:
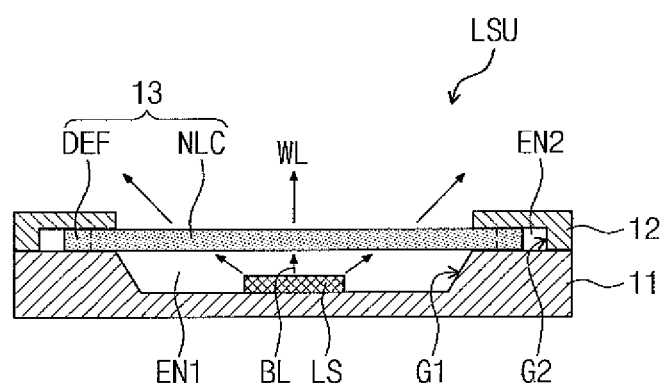

Referring to FIG. 8F, the second sealing member EN2 is cured by, for example, heat or ultraviolet light to hold the quantum dot member 13. When the second sealing member EN2 is not used, the boundary surface of the quantum dot member 13 is exposed to the external air and humidity and the chemical reaction occurs at the boundary surface of the quantum dot member 13. However, as the boundary surface of the quantum dot member 13 is covered by the second sealing member EN2, the quantum dot member 13 may be protected from the external air and humidity by the second sealing member EN2.

As described above, as the blue light BL emitted from the light source LS is provided to the light conversion area NLC of the quantum dot member 13 but not to the defect area DEF, the light conversion is performed normally. Therefore, the light conversion characteristics of the light source unit LSU manufactured by the above-mentioned method are increased.

Figure 9:
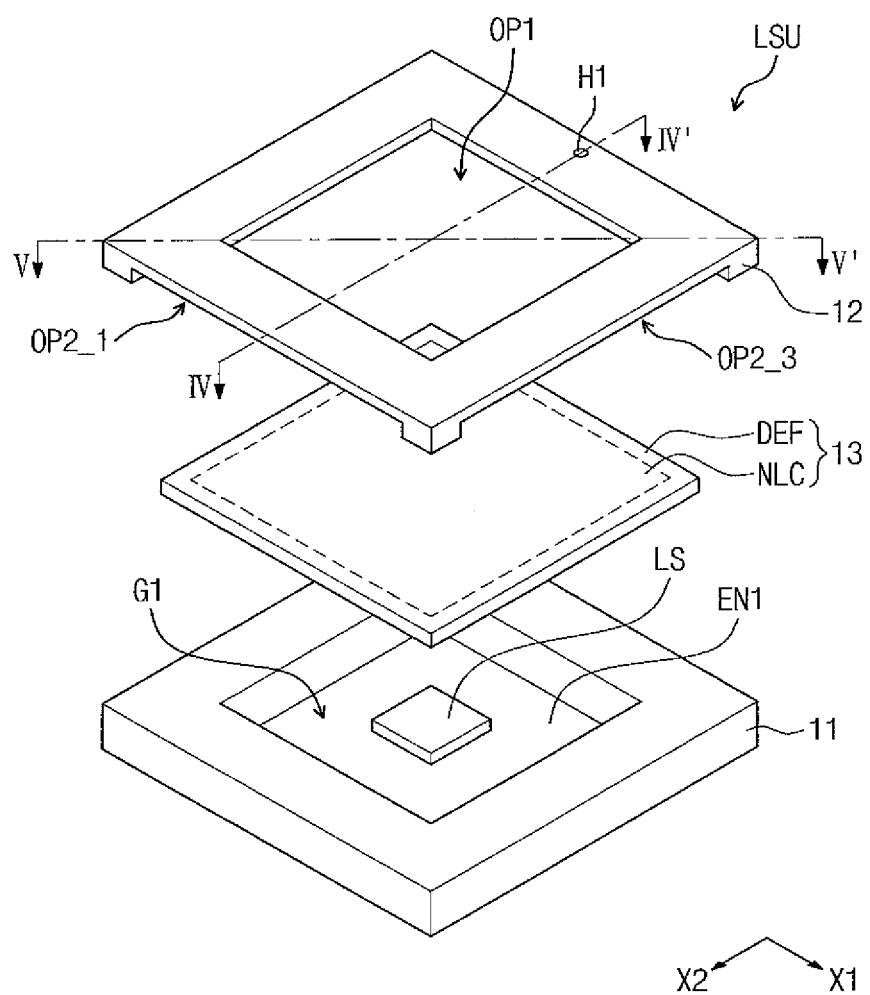
FIG. 9 is an exploded perspective view showing a light source unit according to an exemplary embodiment of the present invention.
Figure 10:
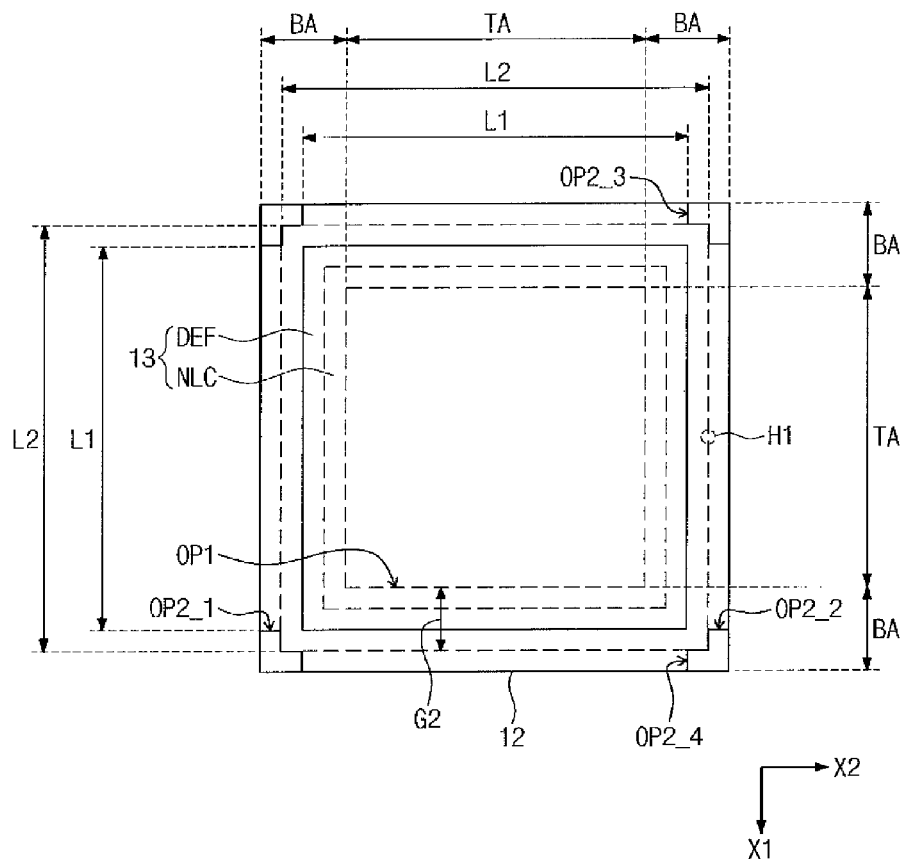
FIG. 10 is a bottom view showing the second case and the quantum dot member shown in FIG. 9.
Figure 11:
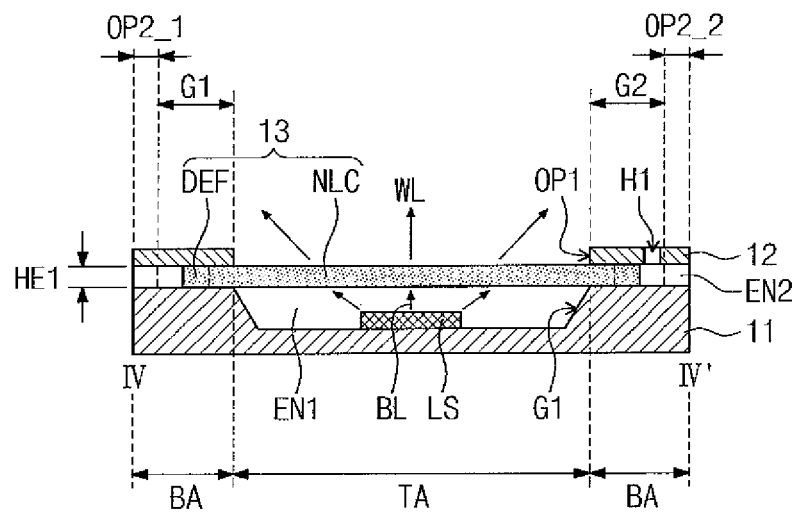
FIG. 11 is a cross-sectional view taken along a line IV-IV' shown in FIG. 9.
Figure 12:
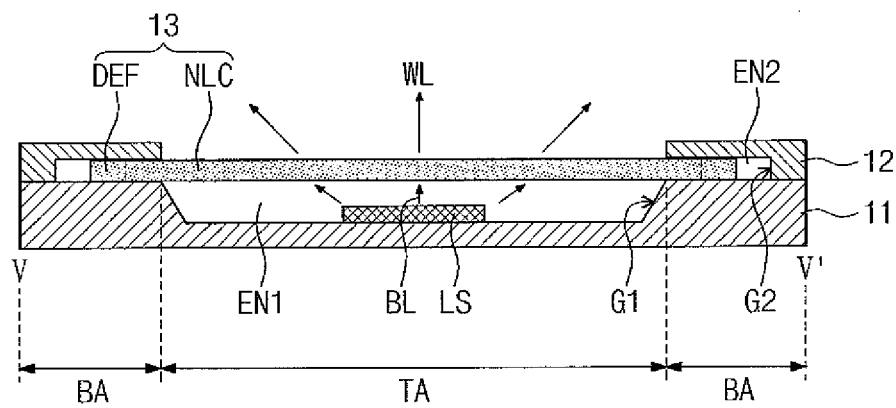
FIG. 12 is a cross-sectional view taken along a line V-V' shown in FIG. 9.

FIG. 9 is an exploded perspective view showing a light source unit according to a second exemplary embodiment of the present invention, FIG. 10 is a bottom view showing the second case and the quantum dot member shown in FIG. 9, FIG. 11 is a cross-sectional view taken along a line IV-IV' shown in FIG. 9, and FIG. 12 is a cross-sectional view taken along a line V-V' shown in FIG. 9.

The light source unit LSU shown in FIG. 9 has the substantially same configurations as those of the light source unit LSU shown in FIG. 1 except for the second case thereof. Accordingly, hereinafter the second case will be described in detail and the same elements will be assigned with the same reference numerals.

Referring to FIGS. 9 to 12, the light source unit LSU includes, for example, a first case 11, a light source LS, a second case 12, and a quantum dot member 13. The light source LS is disposed in the first groove G1 of the first case 11. The first sealing member EN1 is disposed in the first groove G1 to cover the light source LS. The quantum dot member 13 is disposed between the first case 11 and the second case 12. The first case 11 is coupled to the second case 12, and thus the quantum dot member 13 is fixed between the first and second cases 11 and 12.

The configurations of the first case 11, the light source LS, and the quantum dot member 13 are the same as those of the first case 11, the light source LS, and the quantum dot member 13, and thus detailed descriptions of the first case 11, the light source LS, and the quantum dot member 13 will be omitted.

The second case 12 includes, for example, a first opening portion OP1, a plurality of second opening portions OP2_1, OP2_2, OP2_3, and OP2_4, a second groove G2, and a first hole H1. The first opening portion OP1 is formed through the second case 12.

As shown in FIGS. 11 and 12, the first opening portion OP1 is disposed to overlap with the first groove G1. The first opening portion OP1 has, for example, the same shape and size as those of the first groove G1 when viewed in a top view of the second case 12.

The second opening portions OP2_1, OP2_2, OP2_3, and OP2_4 include, for example, a second first opening portion OP2_1, a second second opening portion OP2_2, a second third opening portion OP2_3, and a second fourth opening portion OP2_4.

The second first opening portion OP2_1 is disposed at a front side of the second case 12 and the second second opening portion OP2_2 is disposed at a rear side of the second case 12. In addition, the second third opening portion OP2_3 is disposed at a left side of the second case 12, and the second fourth opening portion OP2_4 is disposed at a right side of the second case 12.

The second first to second fourth opening portions OP2_1, OP2_2, OP2_3, and OP2_4 are formed by, for example, upwardly recessing a lower surface of the second case 12. For example, the second first opening portion OP2_1 and the second second opening portion OP2_2 are extended in a first direction X1, and the second third opening portion OP2_3 and the second fourth opening portion OP2_4 are extended in a second direction X2.

The second first opening portion OP2_1 and the second second opening portion OP2_2 have, for example, the same length as that of the quantum dot member 13 in the first direction X1. In addition, the second first opening portion OP2_1, the second second opening portion OP2_2, and the quantum dot member 13 have, for example, a first length L1.

The second third opening portion OP2_3 and the second fourth opening portion OP2_4 have, for example, the same length as that of the quantum dot member 13 in the second direction X2. In addition, the second third opening portion OP2_3, the second fourth opening portion OP2_4, and the quantum dot member 13 have, for example, the first length L1.

The second groove G2 is formed by, for example, upwardly recessing the lower surface of the second case 12. The second groove G2 has, for example, a second length L2 in the first and second directions X1 and X2. The second length L2 of the second groove G2 is, for example, longer than the first length L1 of the second first to second fourth opening portions OP2_1, OP2_2, OP2_3, and OP2_4.

The second first and second second opening portions OP2_1 and OP2_2 are disposed to, for example, overlap with the second groove G2 in the second direction X2. In addition, the second third and second fourth opening portions OP2_3 and OP2_4 are disposed to, for example, overlap with the second groove G2 in the first direction X1. The second groove G2 is inwardly spaced apart from front, rear, left, and right surfaces of the second case 12 by a predetermined distance.

A predetermined area of a center portion of the second groove G2 is connected with the first opening portion OP1, and thus the predetermined area of the center portion of the second groove G2 is exposed to the upper direction. The second groove G2 is connected with the second first opening portion OP2_1 in the front surface direction of the second case 12, and thus the second groove G2 is exposed to the front surface direction. The second groove G2 is connected with the second second opening portion OP2_2 in the rear surface direction of the second case 12, and thus the second groove G2 is exposed to the rear surface direction.

The second groove G2 is connected with the second third opening portion OP2_3 in the left surface direction of the second case 12, and thus the second groove G2 is exposed to the left surface direction. The second groove G2 is connected with the second fourth opening portion OP2_4 in the rear surface direction of the second case 12, and thus the second groove G2 is exposed to the rear surface direction.

The first hole H1 is formed through the second case 12. For example, the first hole H1 is disposed to overlap with the second groove G2 and the second second opening portion OP2_2 and not to overlap with the quantum dot member 13. For example, the first hole H1 is disposed at a boundary between the second groove G2 and the second second opening portion OP2_2 of the rear surface of the second case 12, and thus the first hole H1 is overlapped with the second groove G2 and the second second opening portion OP2_2.

The quantum dot member 13 is inserted into the second groove G2. The quantum dot member 13 is disposed to be inwardly spaced apart from an outer boundary of the second groove G2 by a predetermined distance. In addition, the quantum dot member 13 is disposed, for example, not to overlap with the first hole H1.

As shown in FIGS. 10 to 12, the predetermined area of the light conversion area NLC of the quantum dot member 13 is disposed to, for example, overlap with the first opening portion OP1 and is exposed through the first opening portion OP1. In addition, the predetermined area of the light conversion area NLC of the quantum dot member 13 is disposed to, for example, overlap with the first groove G1 as shown in FIGS. 11 and 12.

The defect area DEF of the quantum dot member 13 is, for example, inwardly spaced apart from the outer boundary of the second groove G2 by a predetermined distance and partially overlapped with the second groove G2. In addition, the defect area DEF of the quantum dot member 13 is spaced apart from the inner side surface of the second groove G2.

As shown in FIGS. 11 and 12, the second sealing member EN2 is disposed in the area of the second groove G2, in which the quantum dot member 13 is not disposed, and in the second first to second fourth opening portions OP2_1, OP2_2, OP2_3, and OP2_1. The second sealing member EN2 holds the quantum dot member 13 and protects the quantum dot member from the external air and humidity.

Each of the quantum dot member 13, the second first to second fourth opening portions OP2_1, OP2_2, OP2_3, and OP2_4, and the second groove G2 has, for example, a first height HE1. That is, the height of the quantum dot member 13, the height of the second first to second fourth opening portions OP2_1, OP2_2, OP2_3, and OP2_4, and the height of the second groove G2 are, for example, the same.

The predetermined area of the light conversion area NLC of the quantum dot member 13 is disposed to correspond to the transmission area TA, and the defect area DEF of the quantum dot member 13 is disposed to correspond to the blocking area BA.

The blue light BL emitted from the light source LS transmits through the light conversion area NLC of the quantum dot member 13 overlapped with the first groove G1. The light conversion area NLC of the quantum dot member 13 converts the blue light BL provided from the light source LS to the white light WL. The white light WL converted in the light conversion area NLC overlapped with the first groove G1 travels to the outside of the second case 12 through the first opening portion OP1 of the second case 12.

The defect area DEF of the quantum dot member 13 is disposed to correspond to the blocking area BA of the first and second cases 11 and 12. The blue light BL emitted from the light source LS is not provided to the blocking area BA of the quantum dot member 13, and thus the blue light BL emitted from the light source LS is not provided to the defect area DEF. As a result, the light conversion is not performed in the defect area DEF.

The blue light BL emitted from the light source LS is provided to the light conversion area NLC of the quantum dot member 13 but not to the defect area DEF of the quantum dot member 13. The light conversion is performed normally in the light conversion area NLC of the quantum dot member 13, so that the blue light BL is converted to the white light WL in the light conversion area NLC of the quantum dot member 13.

As described above, as the blue light BL emitted from the light source LS is provided to the light conversion area NLC of the quantum dot member 13 but not to the defect area DEF, the light conversion is performed normally. Thus, the light conversion characteristics of the light source unit LSU are increased.

Consequently, the light source unit LSU may have increased light conversion characteristics.

FIGS. 13A to 13G are views showing a method of manufacturing the light source shown in FIG. 9.

Figure 13A:
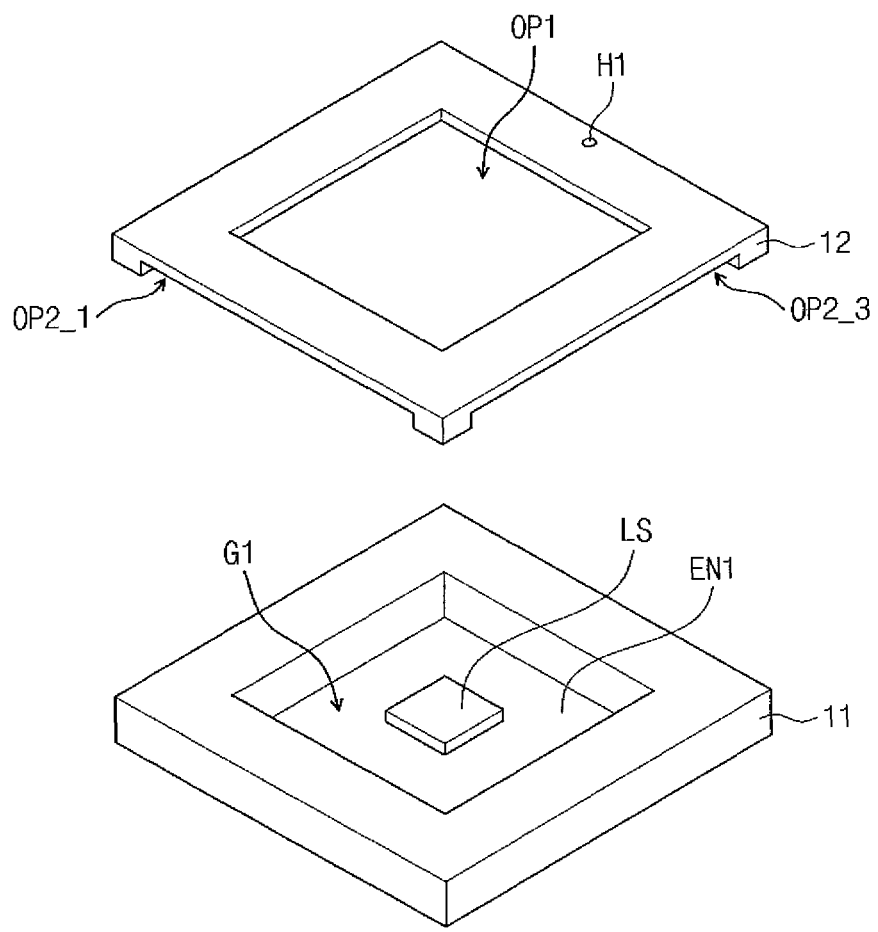
FIGS. 13A to 13G are views showing a method of manufacturing the light source shown in FIG. 9.

Referring to FIG. 13A, the light source LS is accommodated in the first groove G1 and the first sealing member EN1 is disposed in the first groove G1 to cover the light source LS, thereby preparing the first case 11. The second case 12 is disposed on the first case 11 to overlap with the first case 11.

As described above, the first groove G1 of the first case 11 is overlapped with the first opening portion OP1 of the second case 12. The first case 11 is coupled to the second case 12 while being overlapped with each other.

Figure 13B:
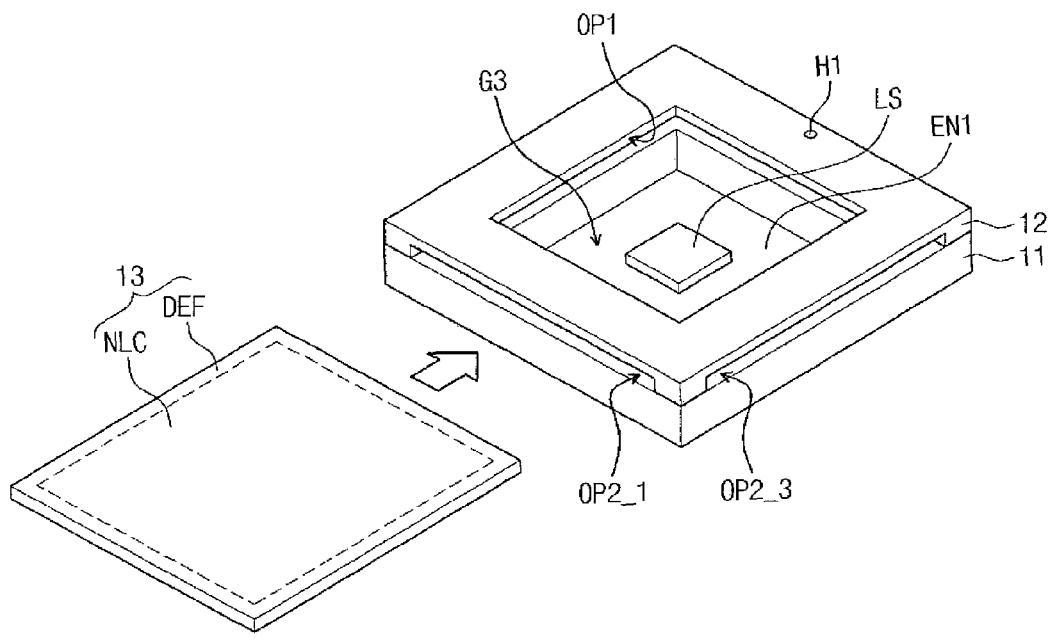

Referring to FIG. 13B, the quantum dot member 13 is disposed between the first case 11 and the second case 12. For example, the quantum dot member 13 is inserted into the second groove G2 through one of the second opening portions OP2_1, OP2_2, OP2_3, and OP2_4 disposed between the first case 11 and the second case 12. For instance, the quantum dot member 13 is inserted into the second groove G2 through the second first opening portion OP2_1.

Figure 13C:
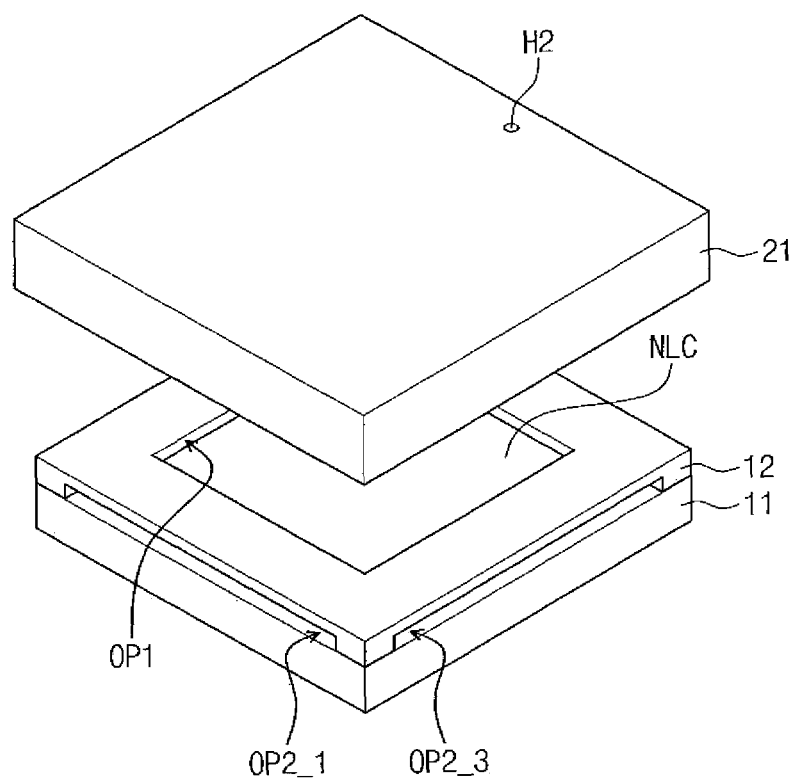
Figure 13D:
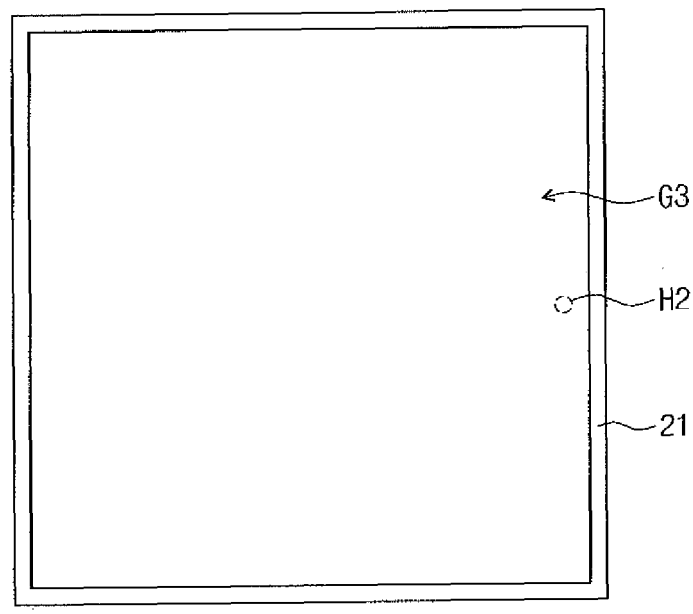

Referring to FIGS. 13C and 13D, a case cover 21 is disposed on the first and second cases 11 and 12 coupled to each other. The case cover 21 includes, for example, a third groove G3 and a second hole H2. The case cover 21 moves downwardly to cover the first and second cases 11 and 12.

Figure 13E:
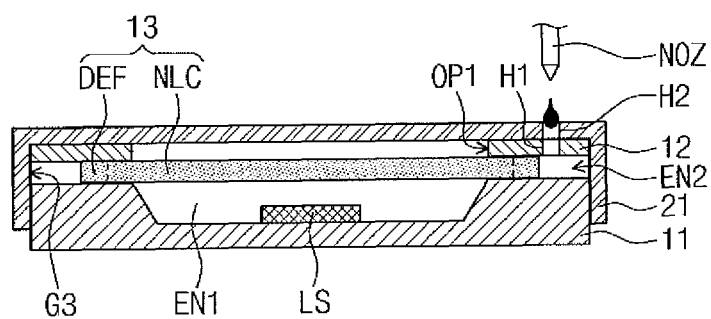

Referring to FIG. 13E, the predetermined area of the light conversion area NLC of the quantum dot member 13 is disposed, for example, to overlap with the first opening portion OP1 and is exposed through the first opening portion OP1. In addition, the predetermined area of the light conversion area NLC of the quantum dot member 13 is disposed to, for example, overlap with the first groove G1.

The third groove G3 of the case cover 21 is formed by, for example, upwardly recessing a lower surface of the case cover 21. In addition, the third groove G3 has, for example, the same shape as the first and second cases 11 and 12 and is disposed to overlap with the first and second cases 11 and 12 when viewed in a plan view. Accordingly, the first and second cases 11 and 12 are inserted into the third groove G3 of the case cover 21.

The second hole H2 of the case cover 21 is, for example, overlapped with the first hole H1 of the second case 12. The second hole H2 is formed through the case cover 21. A nozzle NOZ is disposed at a position corresponding to the second hole H2. The second sealing member EN2 is injected into the second hole H2.

Figure 13F:
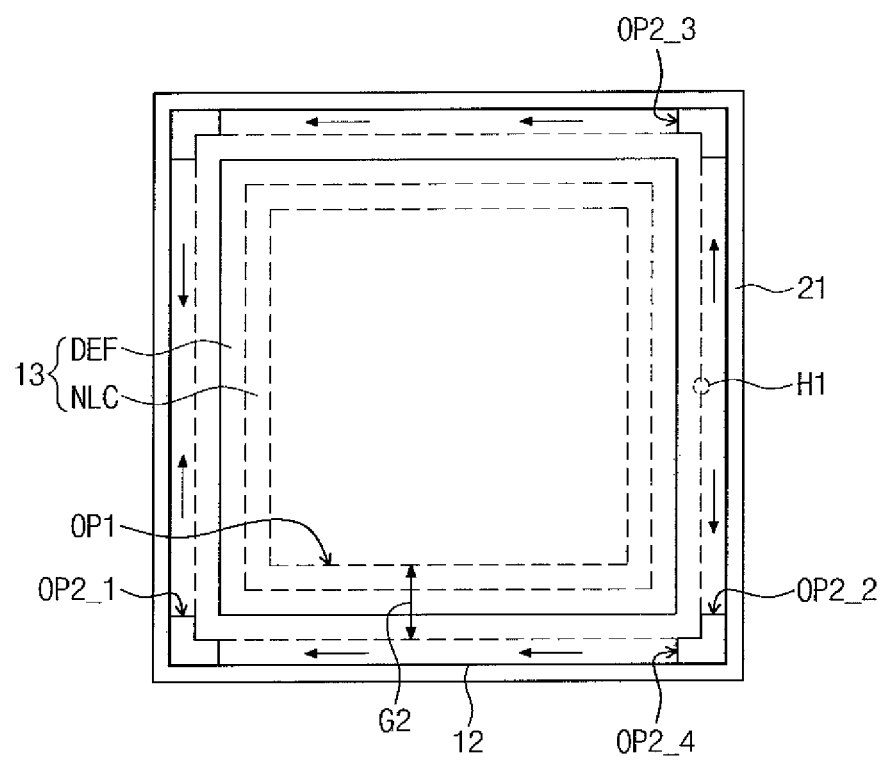

Referring to FIG. 13F, the quantum dot member 13 is disposed, for example, not to overlap with the first hole H1. The defect area DEF of the quantum dot member 13 is, for example, inwardly spaced apart from the outer boundary of the second groove G2 by the predetermined distance and disposed to partially overlap with the second groove G2. In addition, the defect area DEF of the quantum dot member 13 is disposed to be spaced apart from the inner side surface of the second groove G2. Therefore, the second sealing member EN2 injected into the second hole H2 is provided to an area of the second groove G2, in which the quantum dot member 13 is not disposed, and the second first to second fourth opening portions OP2_1, OP2_2, OP2_3, and OP2_4 are disposed via the first hole H1.

As the first and second cases 11 and 12 are accommodated in the third groove G3 of the case cover 21, the second first to second fourth opening portions OP2_1, OP2_2, OP2_3, and OP2_4 are isolated from the outside by the case cover 21. Accordingly, the second sealing member EN2 provided to the second first to second fourth opening portions OP2_1, OP2_2, OP2_3, and OP2_4 may be prevented from being leaked out.

Figure 13G:
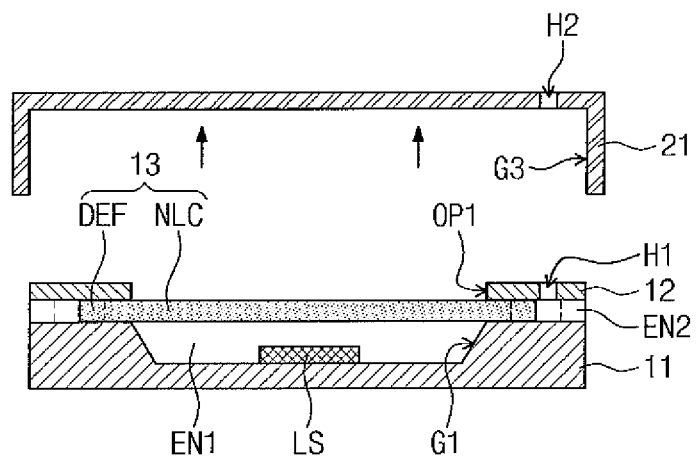

Referring to FIG. 13G, after the second sealing member EN2 is cured by, for example, heat or ultraviolet light, the case cover 21 is separated from the first and second cases 11 and 12. The second sealing member EN2 is cured by, for example, the heat or the ultraviolet light to hold the quantum dot member 13.

When the second sealing member EN2 is not used, the boundary surface of the quantum dot member 13 is exposed to the external air and humidity and the chemical reaction occurs at the boundary surface of the quantum dot member 13. However, as the boundary surface of the quantum dot member 13 is covered by the second sealing member EN2, the quantum dot member 13 may be protected from the external air and humidity by the second sealing member EN2.

As described above, as the blue light BL emitted from the light source LS is provided to the light conversion area NLC of the quantum dot member 13 but not to the defect area DEF, the light conversion is performed normally. Therefore, the light conversion characteristics of the light source unit LSU manufactured by the above-mentioned method are increased.

Figure 14:
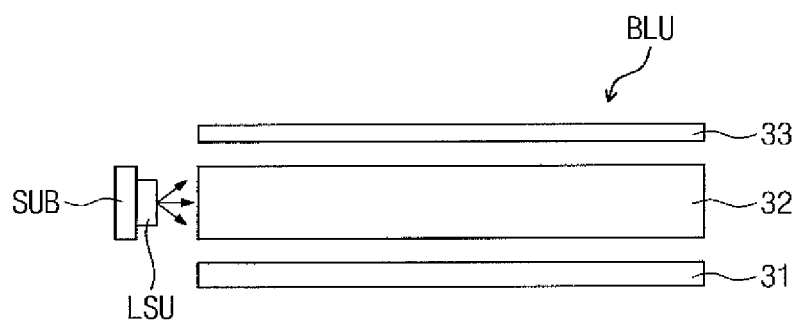
FIGS. 14 and 15 are views showing a backlight unit including one of the light source units shown in FIGS. 1 and 9.
Figure 15:
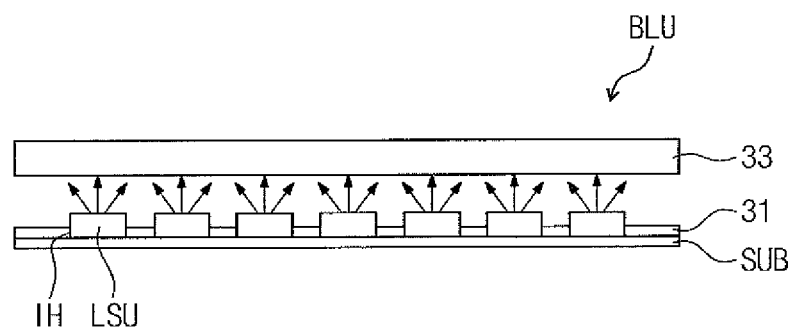

FIGS. 14 and 15 are views showing a backlight unit including one of the light source units shown in FIGS. 1 and 9. For example, FIG. 14 shows an edge-illumination type backlight unit BLU and FIG. 15 shows a direct-illumination type backlight unit BLU. In FIGS. 14 and 15, the same elements will be assigned with the same reference numerals.

Referring to FIG. 14, the edge-illumination type backlight unit BLU includes, for example, a light source unit LSU mounted on a substrate SUB, a reflection plate 31, a light guide plate 32, and an optical sheet 33.

The light source unit LSU is disposed adjacent to one side surface of the light guide plate 32 to emit the light to the light guide plate 32. The light source unit LSU may be, for example, one of the light source units LSU shown in FIGS. 1 to 9. The light source unit LSU emits the white light to the light guide plate 32.

The light guide plate 32 guides the light from the light source unit LSU through the side surface thereof to allow the light to travel to a display panel (not shown) disposed on the backlight unit LSU. Moreover, the light guide plate 32 may be formed of, for example, a resin based material such as polymethylmethacrylate (PMMA), a polyethylene terephthalate (PET) resin, a polycarbonate (PC) resin, a cyclic olefin copolymer (COC) resin, and a polyethylene naphthalate (PEN) resin.

The reflection sheet 31 is disposed under the light guide plate 32 and reflects the light exiting from a lower surface of the light guide plate 32 such that the reflected light travels to the light guide plate 32. For example, in an exemplary embodiment, reflection sheet 31 may be formed of, polyethylene terephthalate (PET) or aluminum. Alternatively, in an exemplary embodiment, the reflection sheet 31 may include other materials such as, for example, polybutylene terephthalate (PBT) or a resin such as polycarbonate (PC) blended in polyethylene terephthalate (PET) or polybutylene terephthalate (PBT).

The optical sheet 33 includes, for example, a diffusion sheet and a prism sheet disposed on the diffusion sheet. The diffusion sheet diffuses the light provided from the light guide plate 32. The prism sheet condenses the light diffused by the diffusion sheet to allow the condensed light to travel the upper direction. The light passing through the prism sheet travels to the direction substantially vertical to an upper surface of the prism sheet with a uniform brightness distribution and is provided to the display panel disposed on the backlight unit BLU. Alternatively, in an embodiment, the optical sheet 33 may further include, for example, a protective sheet disposed on the prism sheet to protect the prism sheet from external impacts. The protective sheet may transmit the light that passes through the prism sheet.

Referring to FIG. 15, the direct-illumination type backlight unit BLU includes, for example, light source units LSU mounted on a substrate SUB, a reflection plate 31, and an optical sheet 33.

The reflection plate 31 is disposed on the substrate SUB and includes, for example, a plurality of insertion holes IH. The light source units LSU are inserted into the insertion holes IH, respectively.

The light source units LSU may be, for example, the light source units LSU shown in FIGS. 1 to 9. The light source units LSU emit the white light.

The reflection plate 31 reflects the light emitted from the light source units LSU and traveling to the reflection plate 31 to allow the reflected light to travel to the upper direction. For example, in an exemplary embodiment, reflection sheet 31 may be formed of, polyethylene terephthalate (PET) or aluminum. Alternatively, in an exemplary embodiment, the reflection sheet 31 may include other materials such as, for example, polybutylene terephthalate (PBT) or a resin such as polycarbonate (PC) blended in polyethylene terephthalate (PET) or polybutylene terephthalate (PBT).

The optical sheet 33 includes, for example, a diffusion sheet (not shown) and a prism sheet (not shown). The diffusion sheet diffuses the light provided from the light source units LSU. The prism sheet condenses the light diffused by the diffusion sheet to allow the condensed light to travel to the direction substantially vertical to the upper surface of the prism sheet. Alternatively, in an embodiment, the optical sheet 33 may further include, for example, a protective sheet disposed on the prism sheet to protect the prism sheet from external impacts. The protective sheet may transmit the light that passes through the prism sheet.

The light emitted from the light source LS is provided to the light conversion area NLC of the quantum dot member 13, which is overlapped with the first groove G1, but not to the defect area DEF of the quantum dot member 13. The light conversion is performed normally in the light conversion area NLC of the quantum dot member 13, so that the light emitted from the light source LS is converted to the white light WL in the light conversion area NLC of the quantum dot member 13.

As described above, as the light emitted from the light source LS is provided to the light conversion area NLC of the quantum dot member 13 but not to the defect area DEF, the light conversion is performed normally. Thus, the light conversion characteristics of the light source unit LSU are increased.

Consequently, the backlight unit BLU including the light source units LSU may have increased light conversion characteristics.

Figure 16:
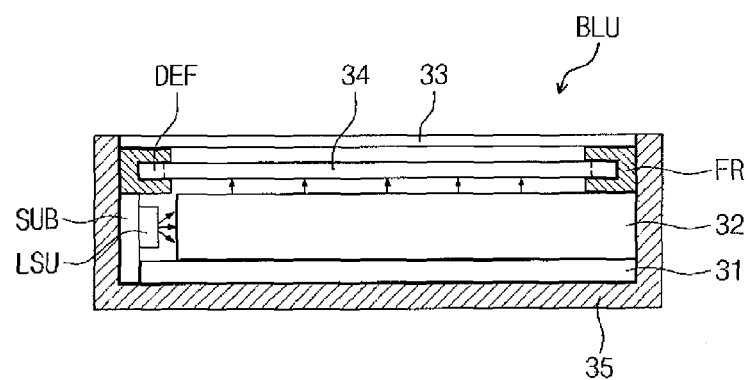
FIG. 16 is a cross-sectional view showing a backlight unit according to an exemplary embodiment of the present invention.

FIG. 16 is a cross-sectional view showing a backlight unit according to an exemplary embodiment of the present invention. For example, the backlight unit BLU shown in FIG. 16 is an edge-illumination type backlight unit BLU.

Referring to FIG. 16, the backlight unit BLU includes, for example, a light source unit LSU mounted on a substrate SUB, a reflection plate 31, a light guide plate 32, an optical sheet 33, a quantum dot member 34, a frame member FR, and a protection member 35.

The light source unit LSU, the reflection plate 31, the light guide plate 32, the optical sheet 33, the quantum dot member 34, and the frame member FR are accommodated in the protective member 35. The protective member 35 may be formed of various materials, such as, for example, a metal chassis, a resin mold, etc.

The light source unit LSU is disposed adjacent to one side surface of the light guide plate 32 to emit the light to the light guide plate 32. The light source unit LSU may be, for example, a blue light emitting diode that emits the blue light.

The light guide plate 32 guides the light provided from the light source unit LSU through the side surface thereof to allow the guided light to travel to the display panel (not shown) disposed on the backlight unit BLU. Moreover, the light guide plate 32 may be formed of, for example, a resin based material such as polymethylmethacrylate (PMMA), a polyethylene terephthalate (PET) resin, a polycarbonate (PC) resin, a cyclic olefin copolymer (COC) resin, and a polyethylene naphthalate (PEN) resin.

The reflection sheet 31 is disposed under the light guide plate 32 and reflects the light exiting from the lower surface of the light guide plate 32 such that the reflected light to travel to the light guide plate 32 again. For example, in an exemplary embodiment, reflection sheet 31 may be formed of, polyethylene terephthalate (PET) or aluminum. Alternatively, in an exemplary embodiment, the reflection sheet 31 may include other materials such as, for example, polybutylene terephthalate (PBT) or a resin such as polycarbonate (PC) blended in polyethylene terephthalate (PET) or polybutylene terephthalate (PBT).

The quantum dot member 34 has, for example, the substantially same configuration as that of the quantum dot member 13 shown in FIGS. 1 and 9. That is, the quantum dot member 34 includes, for example, the light conversion area NLC and the defect area DEF surrounding the light conversion area NLC.

The quantum dot member 34 is fixed to the frame member FR and accommodated in the protection member 35. For example, a predetermined edge area of the quantum dot member 34 is accommodated in the frame member FR. The frame member FR is disposed on the light guide plate 32 after being accommodated in the protection member 35. Accordingly, the quantum dot member 34 is disposed on the light guide plate 32.

The quantum dot member 34 converts the light exiting from the light guide plate 32 to the white light. For example, the defect area DEF of the quantum dot member 34 is accommodated in the frame member FR. The frame member FR is formed of, for example, a plastic material that blocks the light. The predetermined area of the light conversion area NLC of the quantum dot member 34 is exposed without being accommodated in the frame member FR.

As the defect area DEF of the quantum dot member 34 is accommodated in the frame member FR, the light emitted from the light source LS is not provided to the defect area DEF of the quantum dot member 34. Thus, the light conversion is not performed in the defect area DEF of the quantum dot member 34.

The light exiting from the light guide plate 32 is provided to the predetermined area of the light conversion area NLC of the quantum dot member 34, which is not accommodated in the frame member FR, but not to the defect area DEF of the quantum dot member 34. The light conversion is performed normally in the predetermined area of the light conversion area NLC of the quantum dot member 34, which is not accommodated in the frame member FR, and thus the light emitted from the light source unit LSU is converted to the white light.

When the light emitted from the light source unit LSU is a blue light, the blue light is converted to the white light by the predetermined area of the light conversion area NLC of the quantum dot member 34, which is not accommodated in the frame member FR. The white light converted in the light conversion area NLC of the quantum dot member 34 is provided to the optical sheet 33.

The optical sheet 33 includes, for example, a diffusion sheet (not shown) and a prism sheet (not shown) disposed on the diffusion sheet. The diffusion sheet diffuses the white light provided from the quantum dot member 34. The prism sheet condenses the light diffused by the diffusion sheet to allow the condensed light to travel the upper direction. The light passing through the prism sheet travels to the direction substantially vertical to an upper surface of the prism sheet with a uniform brightness distribution and is provided to the display panel (not shown) disposed on the backlight unit BLU. Alternatively, in an embodiment, the optical sheet 33 may further include, for example, a protective sheet disposed on the prism sheet to protect the prism sheet from external impacts. The protective sheet may transmit the light that passes through the prism sheet.

As described above, as the light emitted from the light source LS is provided to the light conversion area NLC of the quantum dot member 34 but not to the defect area DEF, the light conversion is performed normally. Thus, the light conversion characteristics of the backlight unit BLU are increased.

Consequently, the backlight unit BLU may have increased light conversion characteristics.

FIG. 16 shows the edge-illumination type backlight unit BLU, but exemplary embodiments of the present invention are not be limited thereto or thereby. That is, the quantum dot member 34 fixed to the frame member FR may be applied to, for example, the direct-illumination type backlight unit. In other words, the quantum dot member 34 fixed to the frame member FR is disposed, for example, on the light source units in the direct-illumination type backlight unit, and the optical sheet 33 is disposed on the quantum dot member 34.

FIGS. 17A to 17E are views showing a method of fixing the quantum dot member to the frame member shown in FIG. 16.

Figure 17A:
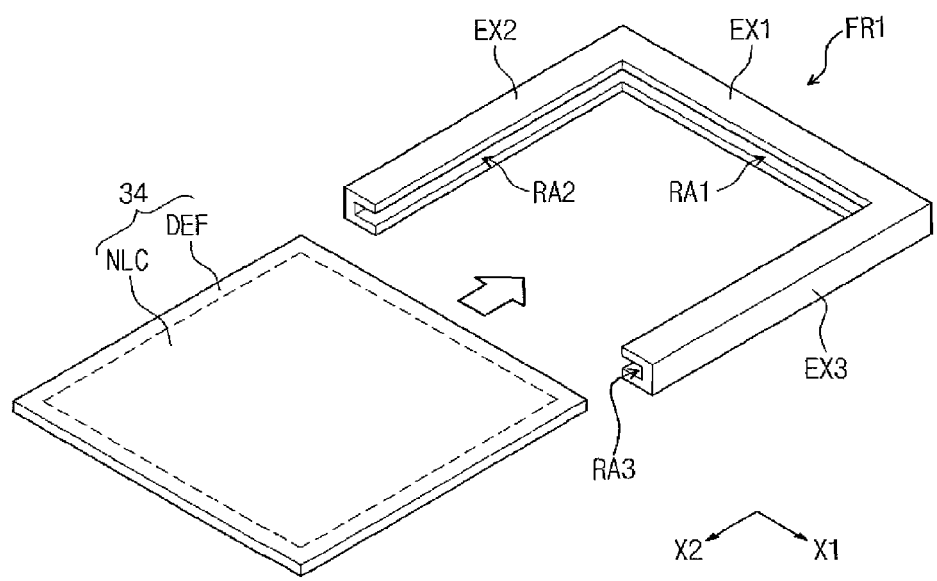
FIGS. 17A to 17E are views showing a method of fixing the quantum dot member to the frame member shown in FIG. 16.

Referring to FIG. 17A, a first frame member FR1 is prepared. The first frame member FR1 includes, for example, a first extension portion EX1 extended in a first direction X1, a second extension portion EX2, and a third extension portion EX3. The second and third extension portions EX2 and EX3 are extended, for example, in a second direction X2 substantially perpendicular to the first direction X1 and respectively connected to both ends of the first extension portion EX1. For example, one end of the second extension portion EX2 and one end of the third extension portion EX3 are connected to both ends of the first extension portion EX1, respectively.

The first extension portion EX1 includes, for example, a first rail portion RA1 recessed inward to the first extension portion EX1 on an inner surface of the first extension portion EX1. The second extension portion EX2 includes, for example, a second rail portion RA2 recessed inward to the second extension portion EX2 on an inner surface of the second extension portion EX2. The third extension portion EX3 includes, for example, a third rail portion RA3 recessed inward to the third extension portion EX3 on an inner surface of the third extension portion EX3.

One end of the second rail portion RA2 and one end of the third rail portion RA3 are connected to both ends of the first rail portion RA1, respectively. The second and third rail portions RA2 and RA3 are disposed to face each other. The quantum dot member 34 is inserted into the first rail portion RA1, the second rail portion RA2, and the third rail portion RA3.

Figure 17B:
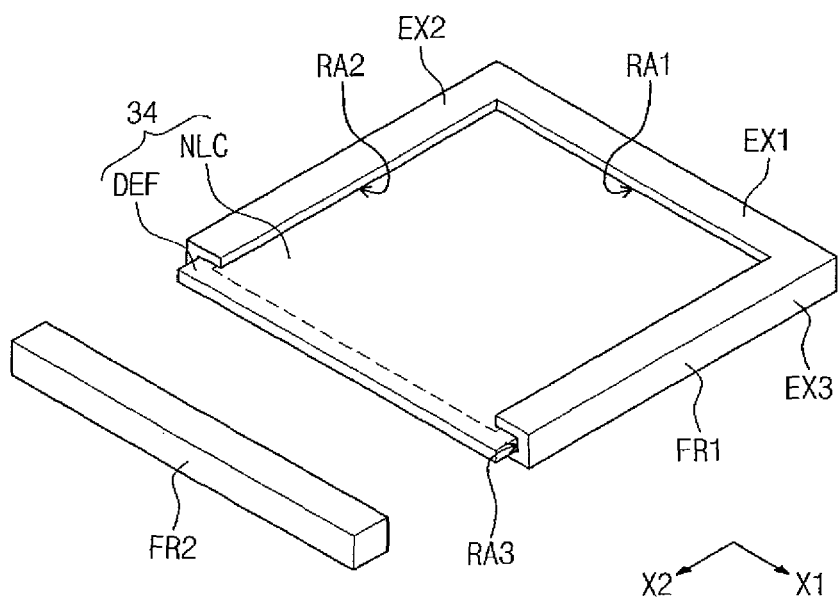
Figure 17C:
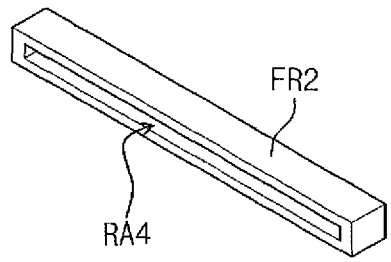

Referring to FIGS. 17B and 17C, a second frame member FR2 is prepared. The second frame member FR2 is extended, for example, in the first direction X1 and has the same size as the first extension portion EX1 of the first frame member FR1. The frame member FR includes, for example, the first and second frame members FR1 and FR2.

As shown in FIG. 17C, the second frame member FR2 includes, for example, a fourth rail portion RA4 recessed inward to the second frame member FR2 on an inner surface of the second frame member FR2. The fourth rail portion RA4 is disposed to face the first rail portion RA1.

The second extension portion EX2 and the third extension portion EX3 are connected to both ends of the second frame member FR2, respectively. For example, the other end of the second extension portion EX2 and the other end of the third extension portion EX3 are respectively connected to the both ends of the second frame member FR2.

The front side end portion of the quantum dot member 34 is not inserted into the first, second, and third rail portions RA1, RA2, and RA3 to be exposed. The front side end portion of the quantum dot member 34, which is exposed without being inserted into the first, second, and third rail portions RA1, RA2, and RA3 is inserted into the fourth rail portion RA4. In addition, the other end of the second rail portion RA2 and the other end of the third rail portion RA3 are connected to the fourth rail portion RA4.

Figure 17D:
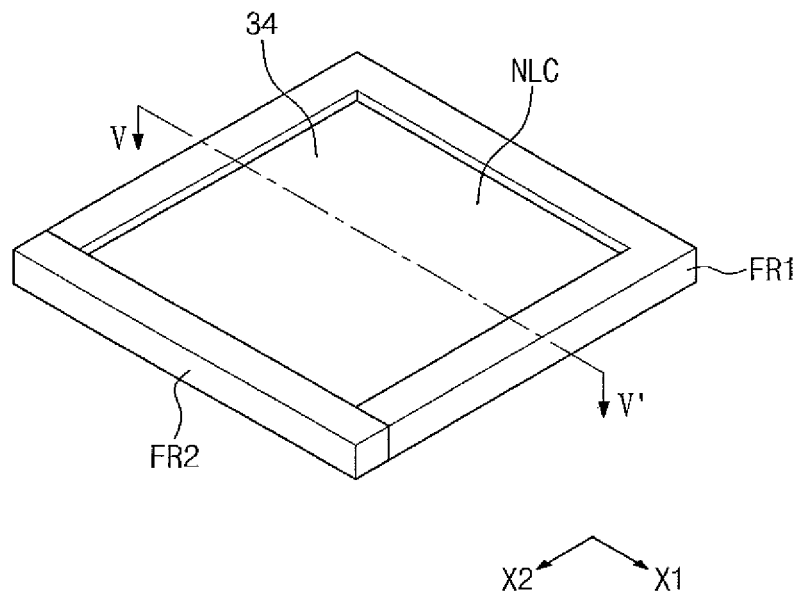
Figure 17E:
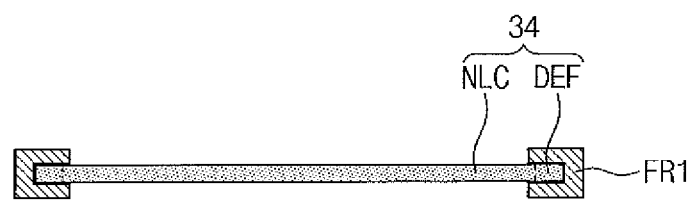

Referring to FIGS. 17D and 17E, the area of the quantum dot member 34, which is adjacent to the boundary of the quantum dot member 34, is accommodated in the first and second frame members FR1 and FR2. For example, the defect area DEF of the quantum dot member 34 is inserted into the first, second, third, and fourth rail portions RA1, RA2, RA3, and RA4 to be accommodated in the first and second frame members FR1 and FR2. The predetermined area of the light conversion area NLC of the quantum dot member 34 is exposed without being inserted into the first and second frames FR1 and FR2.

Figure 18:
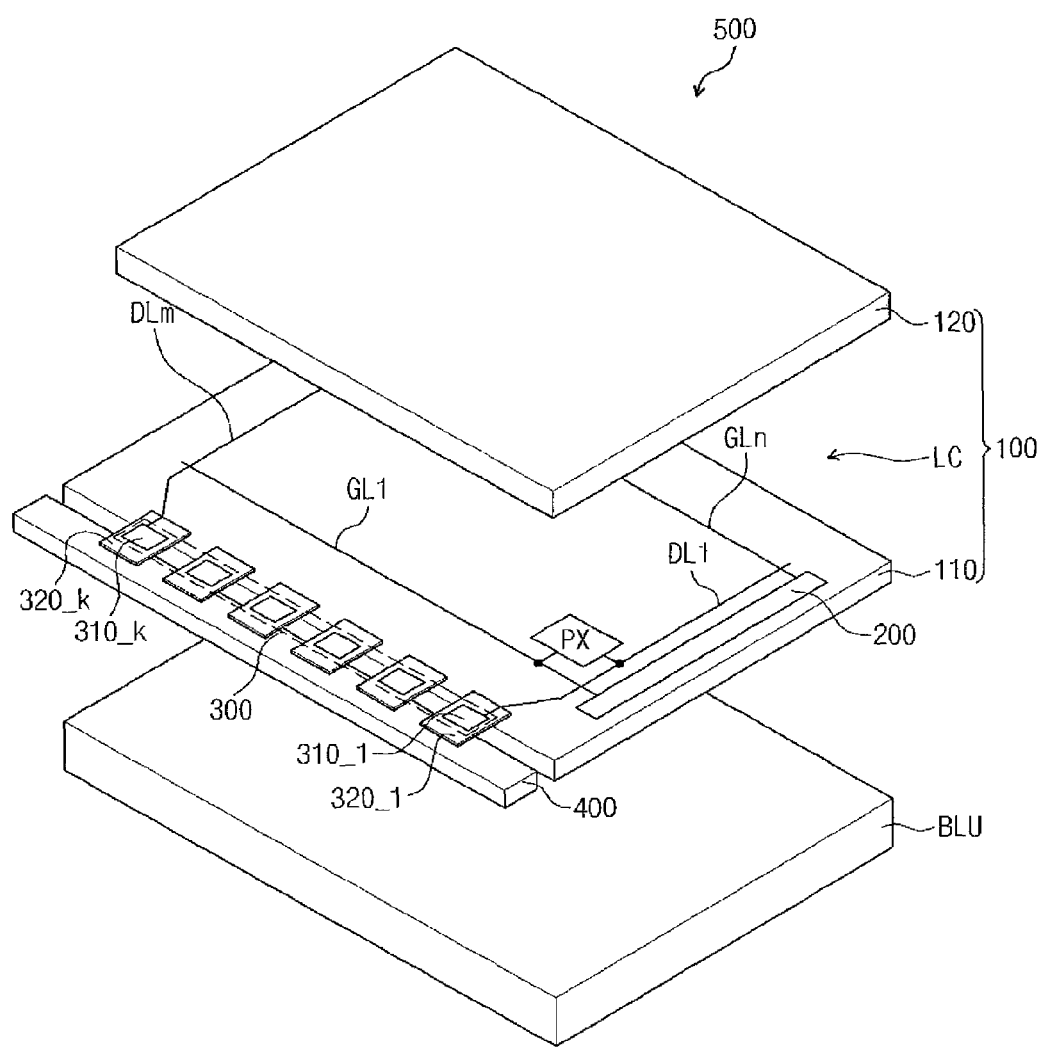
FIG. 18 is a view showing a display device including one of the backlight units shown in FIGS. 14, 15, and 16.

FIG. 18 is a view showing a display device including one of the backlight units shown in FIGS. 14, 15, and 16.

For the convenience of explanation, only one pixel PX has been shown in FIG. 18, but pixels are arranged in areas defined in association with gate lines GL1 to GLn and data lines DL1 to DLm.

Referring to FIG. 18, a display device 500 includes, for example, a display panel 100, a gate driver 200, a data driver 300, a driving circuit board 400, and a backlight unit BLU.

The display panel 100 includes, for example, a thin film transistor substrate 110 on which the pixels PX are arranged, a color filter substrate 120 facing the thin film transistor substrate 110, on which a common electrode (not shown) is formed, and a liquid crystal layer LC disposed between the thin film transistor substrate 110 and the color filter substrate 120. Each of the pixels PX is connected to a corresponding gate line of the gate lines GL1 to GLn and a corresponding data line of the data lines DL1 to DLm.

Each pixel PX includes, for example, a pixel electrode PE and a thin film transistor TFT connected to the pixel electrode PE. The thin film transistor TFT receives a data voltage provided through the corresponding data line in response to a gate signal provided through the corresponding gate line. The data voltage is applied to the pixel electrode PE.

The gate driver 200 generates gate signals in response to a gate control signal provided from a timing controller (not shown) mounted on the driving circuit board 400. The gate signals are sequentially applied to the pixels PX in the unit of row. As a result, the pixels PX may be driven in the unit of row.

The data driver 300 receives image signals and a data control signal from the timing controller. The data driver 300 generates analog data voltages corresponding to the image signals in response to the data control signal. The data driver 300 applies the data voltages to the pixels PX through the data lines DL1 to DLm.

The data driver 300 includes, for example, a plurality of source driving chips 310_1 to 310_k. The source driving chips 310_1 to 310_k are mounted on flexible printed circuit boards 320_1 to 320_k, respectively, and connected to the driving circuit board 400 and the thin film transistor substrate 110.

In the present exemplary embodiment, the source driving chips 310_1 to 310_k are mounted on the flexible printed circuit boards 320_1 to 320_k in, for example, a tape carrier package scheme, but exemplary embodiments of the present invention are not limited thereto or thereby. As another example, the source driving chips 310_1 to 310_k may be mounted on a first non-display area NDA in, for example, a chip-on-glass scheme.

Although not shown in figures, color filters are formed on the color filter substrate 120. The color filters include, for example, color pixels each displaying one of red, green, and blue colors.

The backlight unit BLU may be one of the backlight units shown in FIGS. 14, 15, and 16. The backlight unit BLU is disposed at a rear side of the display panel 100 and supplies the light to the display panel 100. As described above, the light supplied to the display panel 100 from the backlight unit BLU may be, for example, the white light.

When the data voltages are applied to the pixel electrodes PE by the thin film transistors TFT and a common voltage is applied to the common electrode, an alignment of liquid crystal molecules of the liquid crystal layer LC is changed and a transmittance of the light provided from the backlight unit BLU is controlled by the changed alignment of the liquid crystal molecules, thereby displaying the image.

As described above, as the light emitted from the light source LS is provided to the light conversion area NLC of the quantum dot member 13 but not to the defect area DEF, the light conversion is performed normally. Thus, the light conversion characteristics of the backlight unit BLU are increased.

Consequently, the display device 500 including the backlight unit BLU may have increased light conversion characteristics.

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:

1. A light source unit comprising:
a light source configured to emit a light;
a first case defining a first groove configured to receive the light source therein;
a first sealing member disposed in the first groove and covering the light source;
a second case disposed on the first case; and
a quantum dot member disposed between the first case and the second case and including a light conversion area configured to convert the light to a white light and a defect area surrounding the light conversion area,
wherein the second case comprises:
a first opening portion overlapping with the first groove;
a second opening portion disposed at a front surface of the second case, wherein the second opening portion upwardly recesses from a lower surface of the second case, and extends in a first direction substantially parallel to the front surface of the second case;
a second groove which upwardly recesses from the lower surface of the second case and is disposed inwardly spaced apart from the front surface of the second case, a rear surface of the second case, left surface of the second case, and a right surface of the second case; and
a first hole disposed through the second case and disposed adjacent to the rear surface of the second case,
wherein the first opening portion is disposed through the second case,
wherein a portion of the light conversion area overlaps with the first opening portion and the first groove,
wherein the light source unit is configured such that the white light exits therefrom through the first opening portion, and
wherein the second opening portion and the quantum dot member have a first length in the first direction, wherein the second groove has a second length longer than the first length, and wherein the second opening portion is disposed overlapping with the second groove in a second direction vertically crossing the first direction.

2. The light source of claim 1, wherein an area of the first case except for the first groove and an area of the second case except for the first opening portion are configured as a light blocking area to block the light, and the defect area is disposed in the light blocking area.

3. The light source of claim 1, wherein a portion of a center of the second groove is connected to the first opening portion, wherein the second groove is connected to the second opening portion in a front surface direction of the second case, wherein the first hole is overlapped with the second groove and not overlapped with the quantum dot member, and wherein each of the quantum dot member, the second opening portion, and the second groove has a first height in an upper direction.

4. The light source of claim 3, wherein the quantum dot member is disposed in the second opening portion and the second groove, wherein the defect area partially overlaps with the second opening portion and the second groove, and wherein a rear surface of the quantum dot member, a left surface of the quantum dot member, and a right surface of the quantum dot member are spaced apart from an inner surface of the second groove.

5. The light source of claim 4, further comprising a sealing member disposed between the inner surface of the second groove and the rear surface of the quantum dot member, the left surface of the quantum dot member, and the right surface of the quantum dot member.

6. The light source of claim 1, wherein the second case further comprises;
a plurality of second opening portions respectively disposed at a front surface of the second case, a rear surface of the second case, a left surface of the second case, and a right surface of the second case and which upwardly recess from a lower surface of the second case;
a second groove which upwardly recesses from the lower surface of the second case and is disposed inwardly spaced apart from the front surface of the second case, the rear surface of the second case, the left surface of the second case, and the right surface of the second case; and
a first hole disposed through the second case and disposed adjacent to the rear surface of the second case, the second opening portions and the quantum dot member have a first length in a first direction substantially parallel to the front surface of the second case and a second direction vertically crossing the first direction in a plan view, the second groove has a second length longer than the first length in the first and second directions, and
wherein the second opening portions are disposed overlapping with the second groove in the first and second directions.

7. The light source of claim 6, wherein a portion of a center of the second groove is connected to the first opening portion, wherein the second groove is connected to the second opening portions in a front surface direction of the second case, a rear surface direction of the second case, a left surface direction of the second case, and a right surface direction of the second case, wherein the first hole is disposed at a boundary between the second groove and the second opening portion disposed at the rear surface of the second case, and wherein each of the quantum dot member, the second opening portions, and the second groove has a first height in an upper direction.

8. The light source of claim 7, wherein the quantum dot member is disposed in the second groove and inwardly spaced apart from an outer boundary of the second groove, and wherein the defect area is inwardly spaced apart from the outer boundary of the second groove and partially overlaps with the second groove.

9. The light source of claim 8, further comprising a second sealing member disposed in an area of the second groove, in which the quantum dot member is not disposed, and the second opening portions are disposed.

10. A backlight unit comprising:
a light source unit according to claim 1; and
an optical sheet configured to diffuse the white light and condense the white light upwards.

11. The backlight unit of claim 10, further comprising a substrate on which the light source unit is mounted, a light guide plate, a reflection plate disposed under the light guide plate, wherein the light source unit is disposed adjacent to a side surface of the light guide plate and is configured to emit the white light to the light guide plate, wherein the reflection plate is configured to reflect light exiting from a lower surface of the light guide plate such that the reflected light travels back to the light guide plate and wherein the optical sheet is disposed above the light guide plate.

12. The backlight unit of claim 10, further comprising a substrate, and a reflection plate mounted on the substrate and including an insertion hole therein, wherein the light source unit is disposed on the substrate through the insertion hole of the reflection plate, wherein the optical sheet is disposed above the light source unit, wherein the reflection plate is configured to reflect the white light emitted from the light source unit and traveling to the reflection plate to allow the reflected white light to travel upwards.

\* \* \* \* \*